(12) United States Patent
Hoshi

(10) Patent No.: US 11,569,351 B2
(45) Date of Patent: Jan. 31, 2023

(54) SEMICONDUCTOR DEVICE

(71) Applicant: FUJI ELECTRIC CO., LTD., Kawasaki (JP)

(72) Inventor: Yasuyuki Hoshi, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 17/242,460

(22) Filed: Apr. 28, 2021

(65) Prior Publication Data

US 2021/0384298 A1 Dec. 9, 2021

(30) Foreign Application Priority Data

Jun. 9, 2020 (JP) .............................. JP2020-100419

(51) Int. Cl.
| | |
|---|---|
| *H01L 29/08* | (2006.01) |
| *H01L 29/06* | (2006.01) |
| *H01L 29/78* | (2006.01) |
| *H01L 29/423* | (2006.01) |

(52) U.S. Cl.
CPC ...... *H01L 29/0856* (2013.01); *H01L 29/0696* (2013.01); *H01L 29/4236* (2013.01); *H01L 29/7813* (2013.01)

(58) Field of Classification Search
CPC ............. H01L 29/0856; H01L 29/0696; H01L 29/04236; H01L 29/7813
USPC ........................................................ 257/288
See application file for complete search history.

(56) References Cited

U.S. PATENT DOCUMENTS

| | | | |
|---|---|---|---|
| 2011/0018004 A1 | 1/2011 | Shimizu et al. | |
| 2018/0197947 A1 | 7/2018 | Iwaya et al. | |
| 2018/0197983 A1* | 7/2018 | Kinoshita | ............... H01L 29/06 |
| 2018/0204905 A1* | 7/2018 | Ohse | ................... H01L 29/1095 |
| 2018/0366549 A1* | 12/2018 | Kojima | ............... H01L 29/7813 |

(Continued)

FOREIGN PATENT DOCUMENTS

| | | |
|---|---|---|
| JP | 2011-023675 A | 2/2011 |
| JP | 4678902 B2 | 4/2011 |

(Continued)

*Primary Examiner* — Igwe U Anya
(74) *Attorney, Agent, or Firm* — Rabin & Berdo, P.C.

(57) ABSTRACT

A main semiconductor device element has first and second p⁺-type high-concentration regions that mitigate electric field applied to bottoms of trenches. The first p⁺-type high-concentration regions are provided separate from p-type base regions, face the bottoms of the trenches in a depth direction, and extend in a linear shape in a first direction that is a same direction in which the trenches extend. Between adjacent trenches of the trenches, the second p⁺-type high-concentration regions are provided scattered in the first direction, separate from the first p⁺-type high-concentration regions and the trenches and in contact with the p-type base regions. Between the second p⁺-type high-concentration regions adjacent to one another in the first direction, n-type current spreading regions or n⁺-type high-concentration regions having an impurity concentration higher than that of the n-type current spreading regions are provided in contact with the second p⁺-type high-concentration regions.

10 Claims, 16 Drawing Sheets

(56) References Cited

U.S. PATENT DOCUMENTS

| | | | |
|---|---|---|---|
| 2019/0165164 A1 | 5/2019 | Kobayashi et al. | |
| 2019/0189756 A1* | 6/2019 | Okumura | H01L 29/0653 |
| 2020/0020797 A1* | 1/2020 | Suzuki | H01L 29/0878 |
| 2020/0168732 A1 | 5/2020 | Mitani et al. | |
| 2021/0013196 A1* | 1/2021 | Hoshi | H01L 27/0255 |

FOREIGN PATENT DOCUMENTS

| | | |
|---|---|---|
| JP | 2017-098403 A | 6/2017 |
| JP | 2019-046908 A | 3/2019 |
| JP | 2019-102555 A | 6/2019 |
| WO | 2017/064948 A1 | 4/2017 |

* cited by examiner

SEMICONDUCTOR DEVICE

CROSS REFERENCE TO RELATED APPLICATIONS

This application is based upon and claims the benefit of priority of the prior Japanese Patent Application No. 2020-100419, filed on Jun. 9, 2020, the entire contents of which are incorporated herein by reference.

BACKGROUND OF THE INVENTION

1. Field of the Invention

Embodiments of the invention relate to a semiconductor device.

2. Description of the Related Art

Among power semiconductor devices that control high voltage and/or large current, there are several types such as bipolar transistors, insulated gate bipolar transistors (IGBTs), and metal oxide semiconductor field effect transistors (MOSFETs) that have insulated gates (MOS gates) having a 3-layered structure including a metal, an oxide film, and a semiconductor. These devices are selectively used according to an intended purpose.

For example, bipolar transistors and IGBTs have high current density compared to MOSFETs and can be adapted for large current but cannot be switched at high speeds. In particular, the limit of switching frequency is about several kHz for bipolar transistors and about several tens of kHz for IGBTs. On the other hand, MOSFETs have low current density compared to bipolar transistors and IGBTs and are difficult to adapt for large current but can be switched at high speeds up to about several MHz.

Further, a MOSFET, unlike an IGBT, has a built-in parasitic diode formed by pn junctions between an n$^-$-type drift region and p-type base regions in a semiconductor substrate (semiconductor chip), the parasitic diode may be used as a freewheeling diode for protecting the MOSFET. Therefore, in an instance in which a MOSFET is used as a device for an inverter, the MOSFET may be used without additionally connecting an external freewheeling diode thereto and is attracting attention from an economical perspective.

Silicon (Si) is used as material for fabricating power semiconductor devices. There is a strong demand in the market for large-current, high-speed power semiconductor devices and thus, IGBTs and power MOSFETs have been intensively developed and improved, and the performance of power devices has substantially reached the theoretical limit determined by the material. Therefore, in terms of power semiconductor devices, semiconductor materials to replace silicon have been investigated and silicon carbide (SiC) has been focused on as a semiconductor material enabling fabrication (manufacture) of a next-generation power semiconductor device having low ON voltage, high-speed characteristics, and high-temperature characteristics.

SiC is a very stable material chemically, has a wide bandgap of 3 eV, and can be used very stably as a semiconductor material even at high temperatures. Further, SiC has a critical electric field strength that is at least ten times that of silicon and therefore, is expected to be a semiconductor material capable of sufficiently reducing ON resistance. Such characteristics of silicon carbide are also applicable to other semiconductors having a bandgap wider than that of silicon (hereinafter, wide bandgap semiconductors), such as, for example, gallium nitride (GaN).

Further, in a MOSFET, configuration of a trench gate structure in which, accompanying large current, a channel (inversion layer) is formed along a sidewall of a trench, in a direction orthogonal to a front surface of a semiconductor chip is advantageous in terms of cost as compared to a planar gate structure in which the channel is formed along the front surface of the semiconductor chip. A reason for this is that unit cell (configuration unit of a device element) density per unit area may be increased with a trench gate structure and therefore, current density per unit area may be increased.

A rate of temperature rise relative to a volume occupied by the unit cells increases by an extent to which device current density is increased and therefore, to enhance discharge efficiency and stabilize reliability, a double-sided cooling structure is necessary. Further, a power semiconductor device that enhances reliability by having a high-function structure in which, on a single semiconductor substrate having a main semiconductor device element that performs a main operation of the power semiconductor device, high-function portions such as a current sensing portion, a temperature sensing portion, and an over-voltage protecting portion are disposed as circuit portions for protecting and controlling the main semiconductor device element.

A structure of a conventional semiconductor device is described. FIG. 21 is a cross-sectional view depicting the structure of the conventional semiconductor device. FIG. 21 depicts a cross-sectional view of the structure along cutting line AA-AA' in FIG. 22. FIG. 22 is a plan view of a layout of a portion of the conventional semiconductor device when the conventional semiconductor device is viewed from a front side of a semiconductor substrate. In FIG. 22, a layout of first and second p$^+$-type high-concentration regions 261, 262 (hatched portions) that mitigate electric field applied to bottoms of trenches 237 of a main semiconductor device element is depicted.

A conventional semiconductor device 220 depicted in FIGS. 21 and 22 includes as the main semiconductor device element, a vertical MOSFET in which MOS gates having a general trench gate structure are provided in a semiconductor substrate (semiconductor chip) 210, at a front surface of the semiconductor substrate 210 containing silicon carbide. The semiconductor substrate 210 is formed by sequentially forming silicon carbide layers 272, 273 that form an n$^-$-type drift region 232 and p-type base regions 234, by epitaxial growth on a front surface of an n$^+$-type starting substrate 271 containing silicon carbide.

The semiconductor substrate 210 has a first main surface that is a surface of the p-type silicon carbide layer 273 and regarded as the front surface and a second main that is a surface of the n$^+$-type starting substrate 271 and regarded as a back surface. The MOS gates are configured by the p-type base regions 234, n$^+$-type source regions 235, p$^{++}$-type contact regions 236, the trenches 237, gate insulating films 238, and gate electrodes 239. The trenches 237 are disposed in a stripe pattern extending in a first direction X (vertical direction in FIG. 22) parallel to the front surface of the semiconductor substrate 210.

In the semiconductor substrate 210, the first and the second p$^+$-type high-concentration regions 261, 262 that mitigate electric field applied to the bottoms of the trenches 237 are provided at positions closer to an n$^+$-type drain region 231 than are the p-type base regions 234. In the first direction X in which the trenches 237 extend, the first and the second p$^+$-type high-concentration regions 261, 262 extend in a linear shape of a length substantially equal to a length of the trenches 237 in a longitudinal direction (the first direction X) and are disposed in a striped pattern.

The first $p^+$-type high-concentration regions 261 are provided separate from the p-type base regions 234 and respectively face the bottoms of the trenches 237 in a depth direction Z. The second $p^+$-type high-concentration regions 262 are provided between adjacent trenches 237 of the trenches 237, separate from the first $p^+$-type high-concentration regions 261 and the trenches 237, and in contact with the p-type base regions 234. A metal silicide film 241, a barrier metal 246, and a source pad 221 are sequentially stacked on the front surface of the semiconductor substrate 210 and function as a source electrode.

A double-sided cooling structure is configured by a wiring structure on the source pad 221 and a cooling fin (not depicted) joined to a drain electrode 251 of the back surface of the semiconductor substrate 210. Reference characters 233, 240, and 240a are n-type current spreading regions, an interlayer insulating film, and contact holes. Reference characters 242, 243, 244, and 245 are metal films configuring the barrier metal 246. Reference characters 247, 248, 249, and 250 are parts configuring the wiring structure on the source pad 221.

As a conventional vertical MOSFET having a trench gate structure, a device has been proposed in which n-type regions are provided that make a depth of trenches (gate trenches) shallower than a depth of p-type base regions and reach an n-type drift region at bottoms of the trenches (for example, refer to Japanese Patent No. 4678902). In Japanese Patent No. 4678902, pn junctions between the p-type base regions at positions deeper than the trenches and the n-type drift region are formed, electric field concentrates at the pn junctions, and the electric field does not concentrate at bottom corner portions of the trenches, whereby breakdown tolerance of the gate insulating films is enhanced and breakdown voltage is increased.

As a conventional vertical MOSFET having a trench gate structure, a device has been proposed in which p-type base regions are configured by first regions having a low impurity concentration and a narrow width and second regions having a high impurity concentration and a wide width (for example, refer to Japanese Laid-Open Patent Publication No. 2011-023675). In Japanese Laid-Open Patent Publication No. 2011-023675, by reducing the width and the impurity concentration of the p-type base regions by the first regions, ON resistance is reduced and by further reducing the width of the first regions and increasing the width of the second regions, punch-through is prevented, the breakdown voltage is maintained, and by the second regions that have a high impurity concentration and a wide width, ohmic contact is formed with a source electrode.

As a conventional vertical MOSFET having a trench gate structure, a device has been proposed in which a region between some trenches (gate trenches) that are adjacent to one another and disposed having a short pitch is free of a parasitic transistor (for example, refer to Japanese Laid-Open Patent Publication No. 2017-098403). In Japanese Laid-Open Patent Publication No. 2017-098403, the pitch between some of the adjacent trenches is reduced, hole current that flows when avalanche occurs is concentrated at p-type floating regions at the bottoms of the trenches, and this place of current concentration is set as a region free of a parasitic transistor, whereby avalanche tolerance may be enhanced.

As a conventional vertical MOSFET having a trench gate structure, a device has been proposed that has an n-type region between $p^+$-type high-concentration regions that mitigate electric field applied to trench (gate trench) bottoms, provided between an $n^-$-type drift region and p-type base regions (for example, refer to International Publication No. WO 2017/064948). In International Publication No. WO 2017/064948, the n-type region between the $p^+$-type high-concentration regions is deeper on a drain side than are the $p^+$-type high-concentration regions and a path of current flowing along a channel passing between the $p^+$-type high-concentration regions adjacent to one another does not narrow easily, whereby ON resistance is reduced while the breakdown voltage is maintained as is.

As a conventional vertical MOSFET having a trench gate structure, a device has been proposed that has, between an $n^-$-type drift region and p-type base regions, $p^+$-type high-concentration regions that mitigate electric field applied to trench (gate trench) bottoms, and a portion of the $p^+$-type high-concentration regions between adjacent trenches are extended toward the p-type base regions and connected to the p-type base regions (for example, refer to Japanese Laid-Open Patent Publication No. 2019-102555). In Japanese Laid-Open Patent Publication No. 2019-102555, the $p^+$-type high-concentration regions between the adjacent trenches are partially reduced in number, whereby hole current that flows when avalanche occurs is easily discharged to the source electrode.

As a conventional vertical MOSFET having a trench gate structure, a device has been proposed that has, between an $n^-$-type drift region and p-type base regions, $p^+$-type high-concentration regions that mitigate electric field applied to trench (gate trench) bottoms, and of these $p^+$-type high-concentration regions, $p^+$-type high-concentration regions between adjacent trenches all extend in a linear shape in a same direction as the trenches, and at positions deeper on a drain side than are the trench bottoms, the $p^+$-type high-concentration regions are disposed in a stripe pattern extending in a direction orthogonal to the trenches (for example, refer to Japanese Laid-Open Patent Publication No. 2019-046908).

In Japanese Laid-Open Patent Publication No. 2019-046908, between a trench and a $p^+$-type high-concentration region that are adjacent to one another in a direction parallel to the front surface of the semiconductor substrate, and, between adjacent $p^+$-type high-concentration regions disposed separate from a trench, at positions deeper on the drain side than is the bottom of the trench, an n-type region having an impurity concentration higher than an impurity concentration of the $n^-$-type drift region is disposed. Due to this n-type region, even when the $p^+$-type high-concentration regions between the $n^-$-type drift region and the p-type base regions are partially disposed, the path of the current that flows along the channel does not narrow easily and the ON resistance is reduced with the breakdown voltage maintained as is.

SUMMARY OF THE INVENTION

According to an embodiment of the invention, a semiconductor device including a semiconductor substrate containing a semiconductor having a bandgap wider than that of silicon, the semiconductor substrate having a first main surface and a second main surface opposite to each other; a first semiconductor region of a first conductivity type, provided in the semiconductor substrate; a second semiconductor region of a second conductivity type, provided between the first main surface of the semiconductor substrate and first semiconductor region; a plurality of third semiconductor regions of the first conductivity type, each selectively provided between the first main surface of the semiconductor substrate and the second semiconductor region; a plurality of trenches each penetrating through the third semiconductor regions and the second semiconductor region, and reaching the first semiconductor region; a plurality of first high-concentration regions of the second conductivity type, each of which is selectively provided in the first semiconductor region and faces a respective one of bottoms of the trenches in a depth direction, the first high-concentration regions having an impurity concentration higher than an impurity concentration of the second semiconductor region; a plurality of second high-concentration regions of the second conductivity type, each of which is selectively provided in the first semiconductor region, is separate from the first high-concentration regions and the trenches, and is in contact with the second semiconductor region, the second high-concentration regions reaching positions deeper from the second semiconductor region than are the bottoms of the trenches and having an impurity concentration higher than the impurity concentration of the second semiconductor region; a plurality of gate electrodes each provided in a respective one of the trenches via a respective one of a plurality of gate insulating films; a first electrode electrically connected to the second semiconductor region, the third semiconductor regions, the first high-concentration regions, and the second high-concentration regions; and a second electrode provided on the second main surface of the semiconductor substrate. The trenches each have a linear shape that extends in a first direction parallel to the first main surface of the semiconductor substrate. The first high-concentration regions each have a linear shape that extends in the first direction. The second high-concentration regions are apart from one another by a predetermined interval in the first direction.

Objects, features, and advantages of the present invention are specifically set forth in or will become apparent from the following detailed description of the invention when read in conjunction with the accompanying drawings.

DETAILED DESCRIPTION OF THE INVENTION

Figure 21:
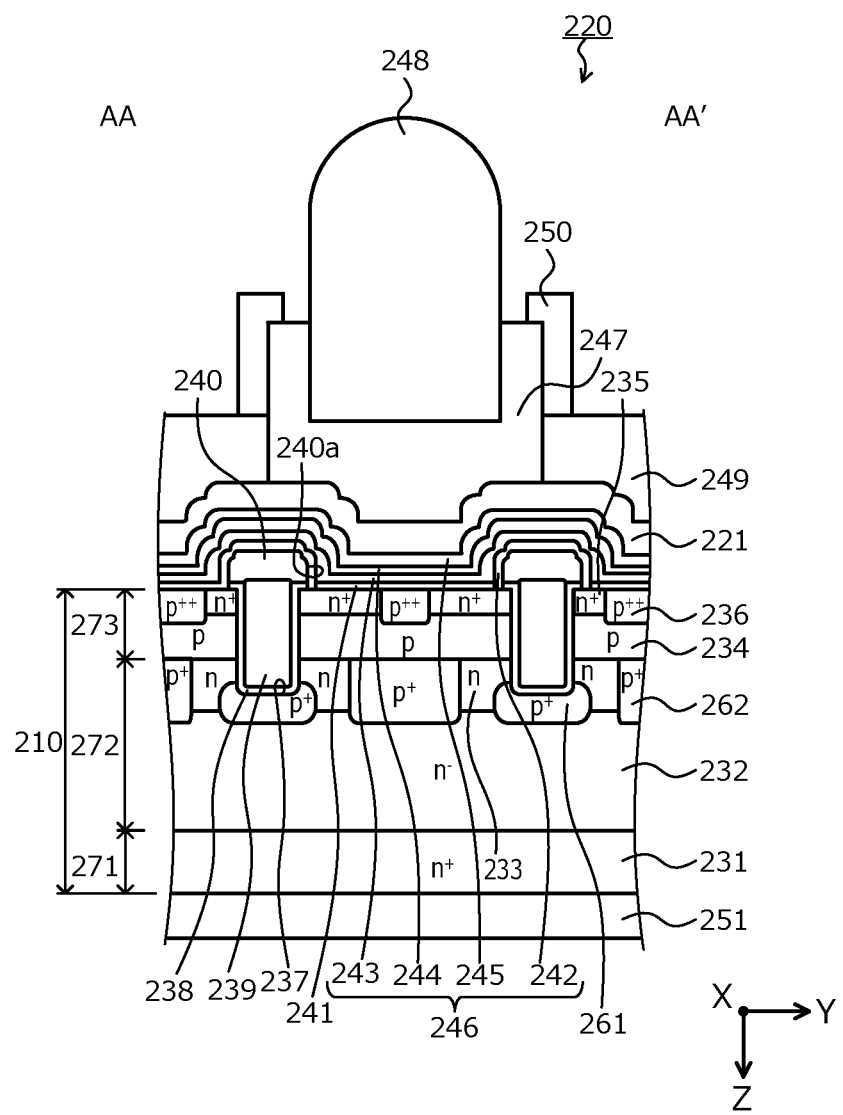
FIG. 21 is a cross-sectional view depicting a structure of a conventional semiconductor device.
Figure 22:
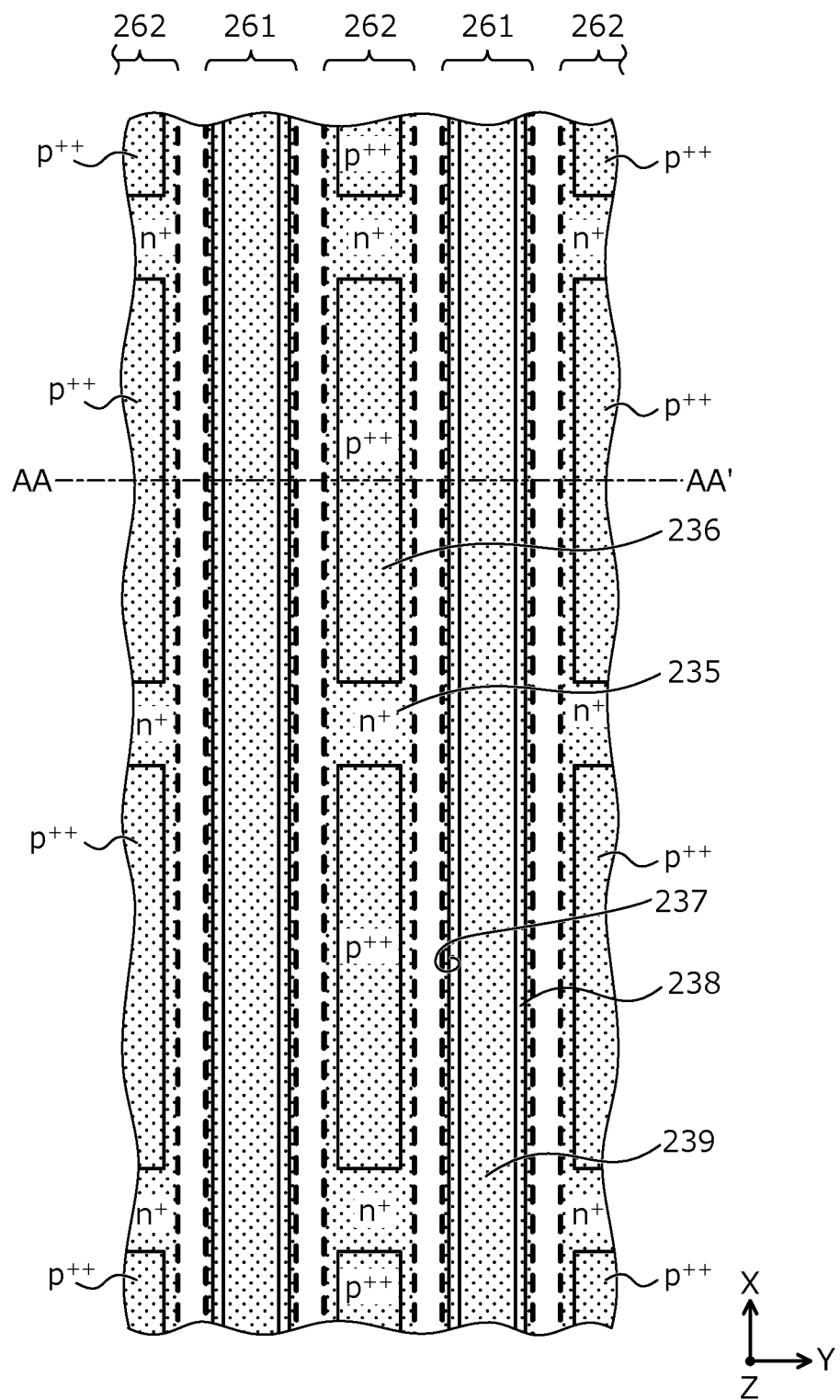
FIG. 22 is a plan view of a layout of a portion of the conventional semiconductor device when the conventional semiconductor device is viewed from a front side of a semiconductor substrate.

First, problems associated with the conventional techniques are discussed. In the main semiconductor device element of the conventional semiconductor device 220 (refer to FIGS. 21 and 22), accompanying miniaturization of the unit cells, a width of the n$^-$-type drift region 232, between the first and the second p$^+$-type high-concentration regions 261, 262 decreases. At a portion where the width decreases, junction FET (JFET) resistance increases and the ON resistance increases, whereby operating loss (power loss) increases. In particular, in an instance in which the semiconductor device 220 has a high-function structure, the ON resistance of the main semiconductor device element has to be reduced and total operating loss of the semiconductor device 220 has to be reduced.

In an instance in which the semiconductor device 220 has a high-function structure, the main semiconductor device element is operated and controlled by an external circuit, based on output signals of high-function portions (not depicted) such as a current sensing portion and a temperature sensing portion so that short circuit withstand capability, etc. is not exceeded. For the main semiconductor device element alone, it is sufficient to set an applied voltage at which a current that is about 4 to 6 times the rated current of the main semiconductor device element flows, as an allowable applied voltage (actual value). Therefore, when the total operating loss of the semiconductor device 220 increases, voltage exceeding the actual value is applied to the main semiconductor device element, and the main semiconductor device element is destroyed or operates erroneously.

Embodiments of a semiconductor device according to the present invention are described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical are given the same reference numerals and will not be repeatedly described.

Figure 1:
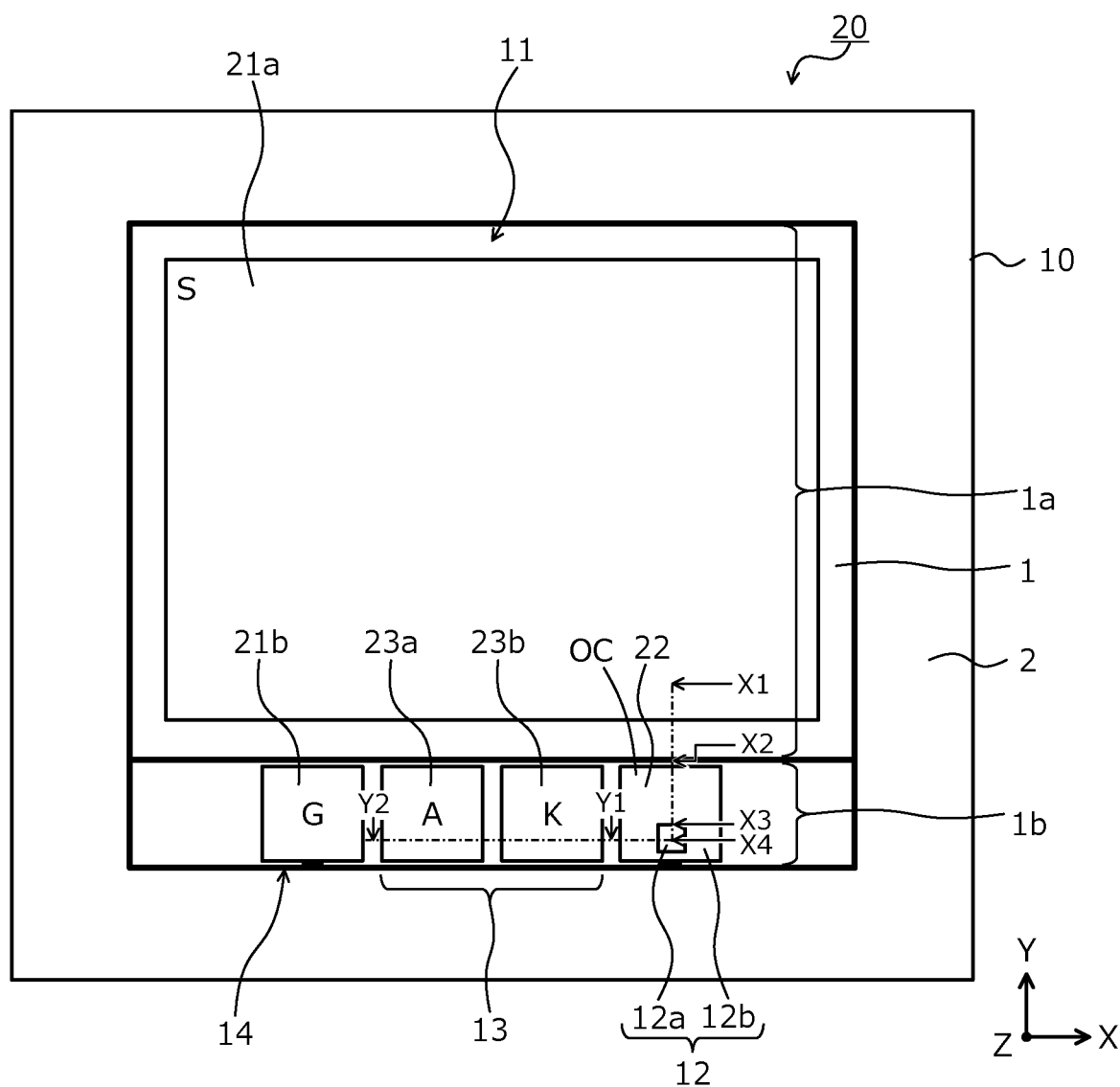
FIG. 1 is a plan view of a layout when a semiconductor device according to an embodiment is viewed from a front side of a semiconductor substrate thereof.

A semiconductor device according to an embodiment is configured using, as a semiconductor, a semiconductor material having a bandgap wider than that of silicon (Si) (wide bandgap semiconductor). Here, a structure of the semiconductor device according to the embodiment is described taking, as an example, an instance in which silicon carbide (SiC) is used as the wide bandgap semiconductor material configuring the semiconductor device according to the embodiment. FIG. 1 is a plan view of a layout when the semiconductor device according to the embodiment is viewed from a front side of a semiconductor substrate thereof.

A semiconductor device 20 according to the embodiment depicted in FIG. 1 has, in an active region 1 of a single semiconductor substrate (semiconductor chip) 10 thereof containing silicon carbide, a main semiconductor device element 11 and at least one circuit portion for protecting and controlling the main semiconductor device element 11. The active region 1 is provided in substantially a center (chip center) of the semiconductor substrate 10. The main semiconductor device element 11 is a vertical MOSFET that performs a main operation of the semiconductor device 20 and is configured by plural unit cells (functional units of a device element) connected in parallel to one another by a source pad 21a described hereinafter.

The main semiconductor device element 11 is disposed in an effective region (hereinafter, main effective region) 1a of the active region 1. The main effective region 1a is a region in which a main current (drift current) of the main semiconductor device element 11 flows in a direction from a back surface of the semiconductor substrate 10, toward a front surface thereof (direction opposite to the depth direction Z), when the main semiconductor device element 11 is ON. The main effective region 1a has, for example, a substantially rectangular shape in a plan view thereof and occupies a majority of a surface area of the active region 1. Three edges of the substantially rectangular shape of the main effective region 1a in a plan view thereof are adjacent to an edge termination region 2 described hereinafter.

The circuit portions for protecting and controlling the main semiconductor device element 11 are, for example, high-function portions such as a current sensing portion 12, a temperature sensing portion 13, an over-voltage protecting portion (not depicted), and an arithmetic circuit portion (not depicted) disposed in a main non-operating region 1b of the active region 1. The main non-operating region 1b is a region free of unit cells of the main semiconductor device element 11 and does not function as the main semiconductor device element 11. The main non-operating region 1b, for example, has a substantially rectangular shape in a plan view thereof and is disposed between a remaining one edge of the substantially rectangular shape of the main effective region 1a in a plan view thereof and the edge termination region 2.

The edge termination region 2 is a region between the active region 1 and an end of the semiconductor substrate 10 (chip end), the edge termination region 2 being adjacent to the active region 1, surrounding a periphery of the active region 1, and having a function of mitigating electric field of a front side of the semiconductor substrate 10 and sustaining breakdown voltage. In the edge termination region 2, for example, a general voltage withstanding structure (not depicted) such as a field limiting ring (FLR) or a junction termination extension (JTE) structure is disposed. The breakdown voltage is a voltage limit at which erroneous operation or destruction of the semiconductor device does not occur.

The source pad (electrode pad) 21a of the main semiconductor device element 11 is disposed on a front surface of the semiconductor substrate 10, in the main effective region 1a. The source pad 21a of the main semiconductor device element 11 is disposed separate from other electrode pads excluding the source pad 21a. The main semiconductor device element 11 has a large current capacity as compared to other circuit portions. Therefore, the source pad 21a of the main semiconductor device element 11 has substantially a same shape as that of the main effective region 1a in a plan view thereof and covers substantially an entire area of the main effective region 1a.

The other electrode pads excluding the source pad 21a are disposed in the main non-operating region 1b, on the front surface of the semiconductor substrate 10, separate from one another. The other electrode pads excluding the source pad 21a are the gate pad 21b of the main semiconductor device element 11, an electrode pad (OC pad) 22 of the current sensing portion 12, electrode pads (anode pad and cathode pad) 23a, 23b of the temperature sensing portion 13, an electrode pad (hereinafter, an OV pad, not depicted) of the over-voltage protecting portion, and an electrode pad (not depicted) of the arithmetic circuit portion, etc.

The other electrode pads excluding the source pad 21a, for example, have a substantially rectangular shape in a plan view thereof and have a surface area necessary for bonding later-described terminal pins 48b, 48c, 48d (refer to FIGS. 3 and 4), wires (not depicted), etc. FIG. 1 depicts an instance in which the other electrode pads excluding the source pad 21a are disposed in a single row along a border between the main non-operating region 1b and the edge termination region 2, in the first direction X. In FIG. 1, the source pad 21a, the gate pad 21b, the OC pad 22, the anode pad 23a, and the cathode pad 23b are depicted as rectangles indicated by "S", "G", "OC", "A", and "K".

The current sensing portion 12 is connected in parallel to the main semiconductor device element 11, operates under conditions similar to those of the main semiconductor device element 11, and has a function of detecting overcurrent (OC) flowing in the main semiconductor device element 11. The current sensing portion 12 is disposed separate from the main semiconductor device element 11. The current sensing portion 12 is a vertical MOSFET having unit cells each configured similarly to the unit cells of the main semiconductor device element 11, the current sensing portion 12 having a fewer number of unit cells (for example, about 10) than the number of unit cells of the main semiconductor device element 11 (for example, at least about one thousand) and having a surface area smaller than that of the main semiconductor device element 11.

The unit cells of the current sensing portion 12 are disposed in a region (hereinafter, sensing effective region, hatched portion) 12a that is a portion of a region of the semiconductor substrate 10 covered by the OC pad 22. The unit cells of the current sensing portion 12 are disposed adjacent to one another in a direction parallel to the front surface of the semiconductor substrate 10. The direction along which the unit cells of the current sensing portion 12 are adjacent to one another, for example, is a same direction as that along which the unit cells of the main semiconductor device element 11 are adjacent to one another. The unit cells of the current sensing portion 12 are connected in parallel to one another by the OC pad 22.

Further, in the region of the semiconductor substrate 10 covered by the OC pad 22, a region thereof excluding the sensing effective region 12a, is a sensing non-operating region 12b that does not function as the current sensing portion 12. The sensing non-operating region 12b is free of the unit cells of the current sensing portion 12. In substantially an entire area of the main non-operating region 1b excluding the sensing effective region 12a, a p-type base region 34b described hereinafter (refer to FIGS. 2 and 3) extends in a surface region of the semiconductor substrate 10 at the front surface thereof, from the sensing effective region 12a.

The temperature sensing portion 13 has a function of detecting a temperature of the main semiconductor device element 11 (the semiconductor substrate 10), using diode temperature characteristics. The temperature sensing portion 13 is disposed directly beneath the anode pad 23a and the cathode pad 23b. The temperature sensing portion 13, for example, may be a polysilicon diode configured by a polysilicon (poly-Si) layer provided on an interlayer insulating film 40 (refer to FIGS. 4 to 4) on the front surface of the semiconductor substrate 10, or may be a diffusion diode formed by pn junctions between p-type regions and n-type regions formed in the semiconductor substrate 10.

The overcurrent protecting portion (not depicted), for example, is a diode that protects the main semiconductor device element 11 from overvoltage (OV) such as surges. The current sensing portion 12, the temperature sensing portion 13, and the overcurrent protecting portion are controlled by the arithmetic circuit portion. The arithmetic circuit portion controls the main semiconductor device element 11 based on output signals from the current sensing portion 12, the temperature sensing portion 13, and the overcurrent protecting portion. The arithmetic circuit portion is configured by multiple semiconductor device elements such as Complementary MOS (CMOS) circuits.

Figure 2:
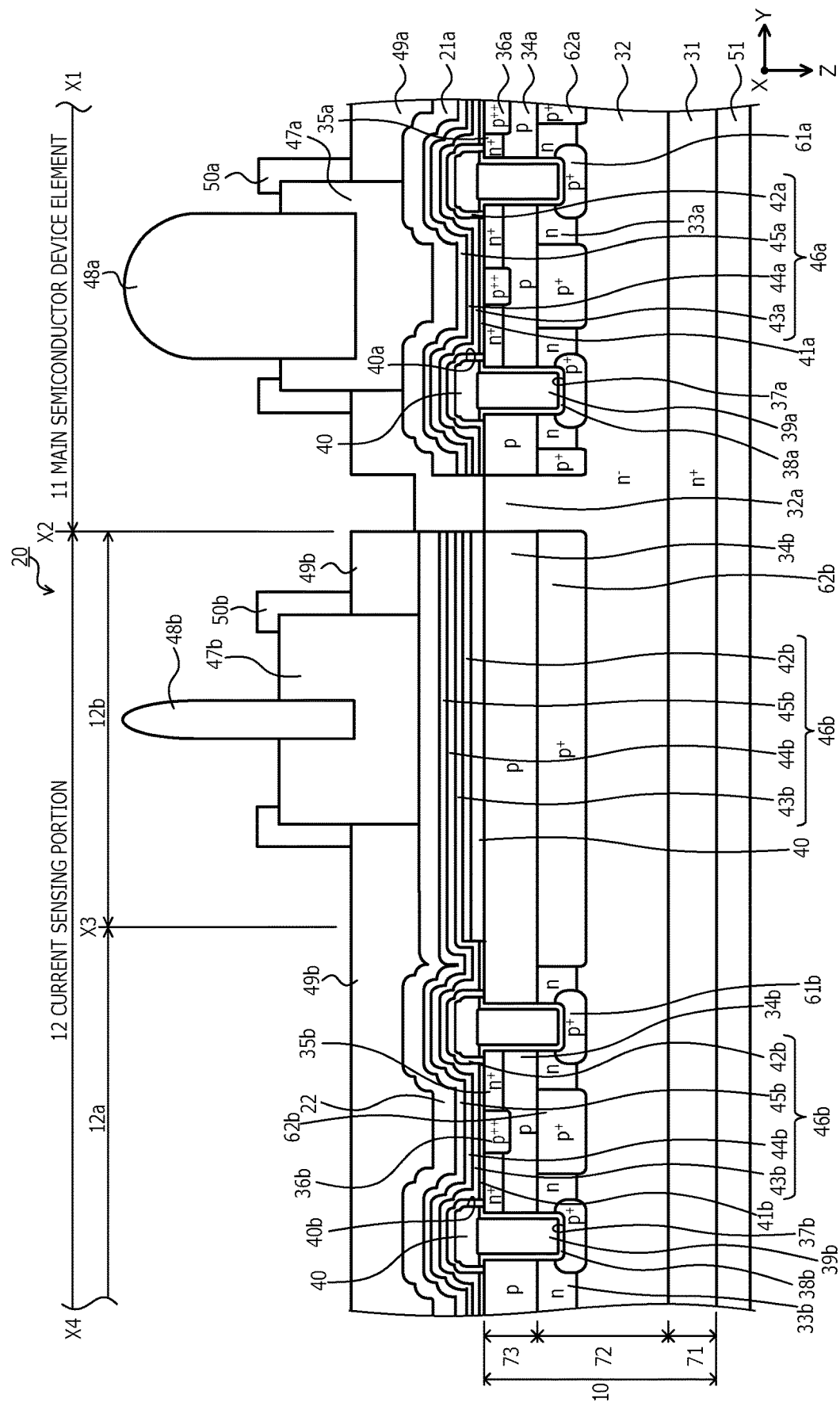
FIG. 2 is a cross-sectional view of a structure of a main effective region and a current sensing portion in FIG. 1.
Figure 3:
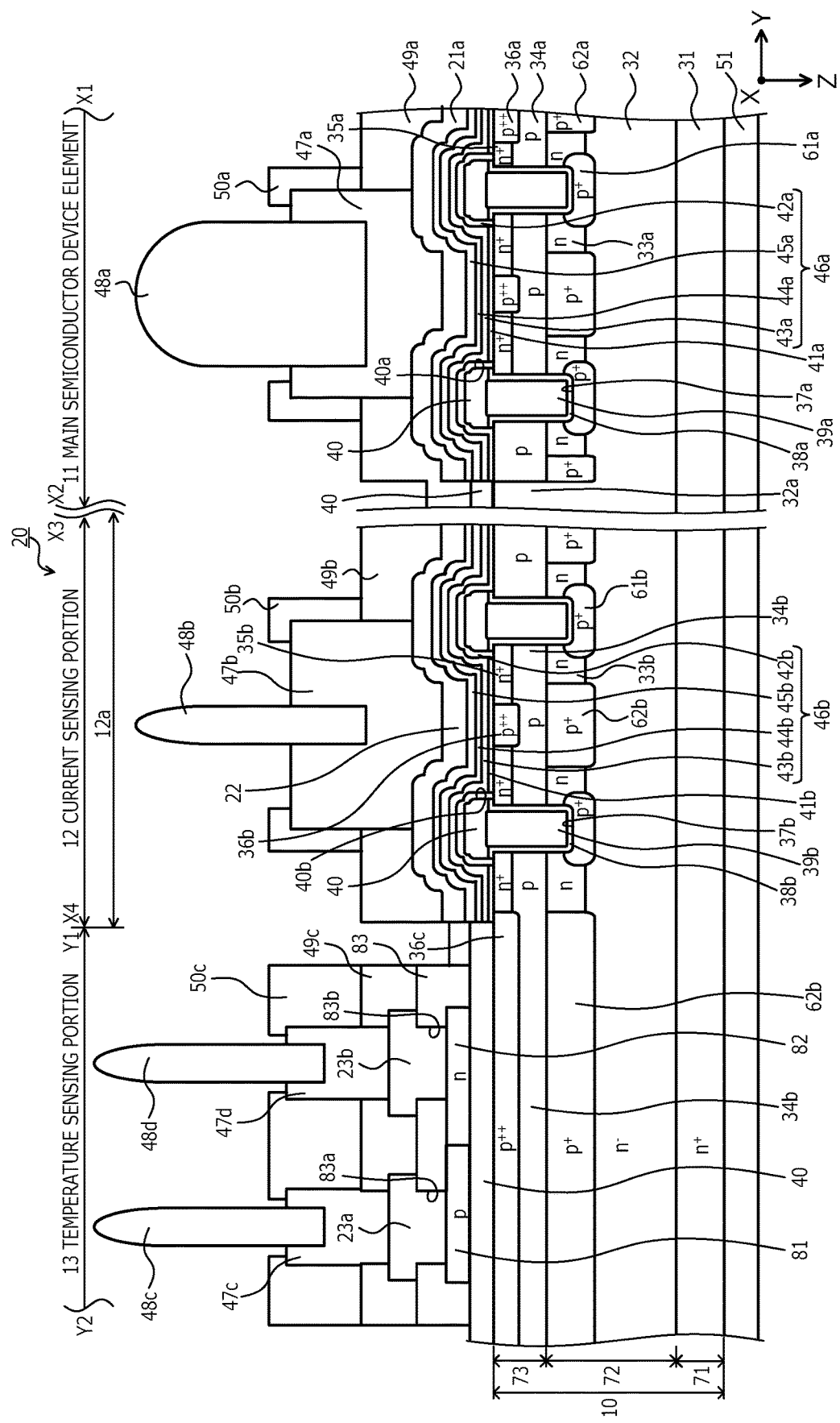
FIG. 3 is a cross-sectional view of the structure of the main effective region, the sensing effective region, and a temperature sensing portion in FIG. 1.
Figure 4:
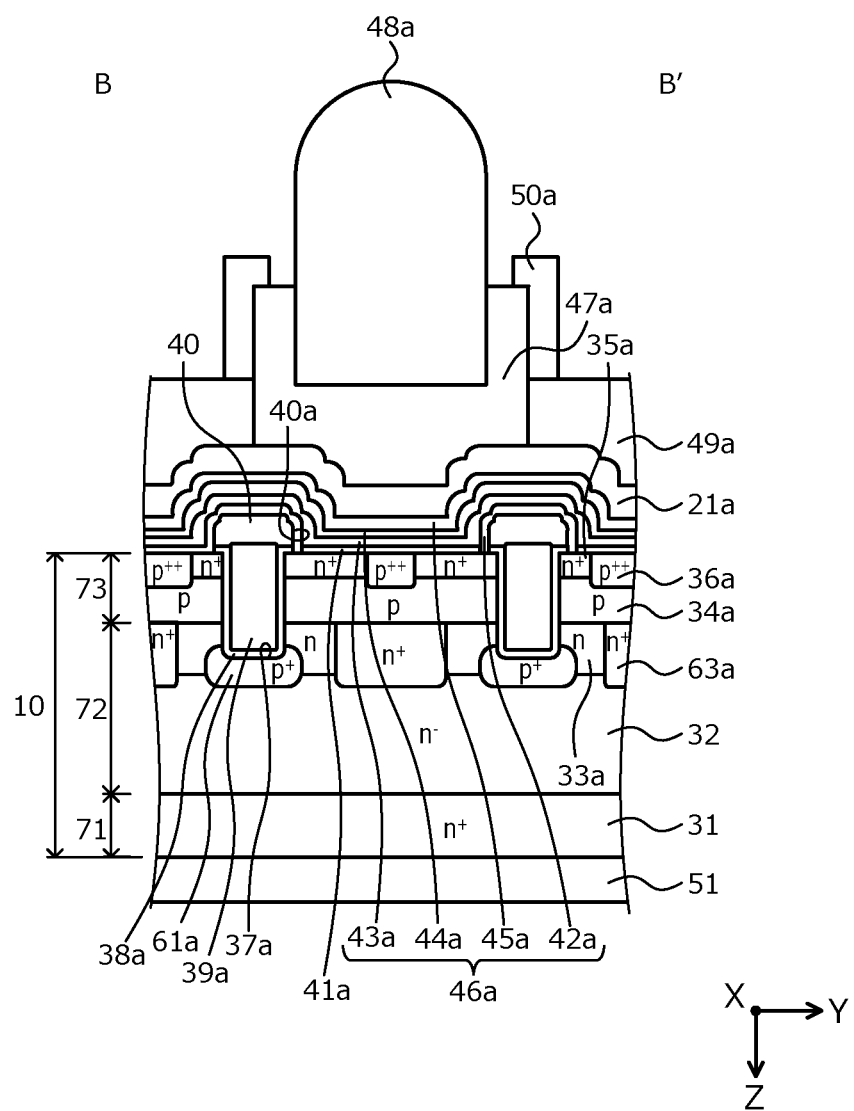
FIG. 4 is a cross-sectional view of the structure along cutting line B-B' in FIG. 5A.
Figure 5A:
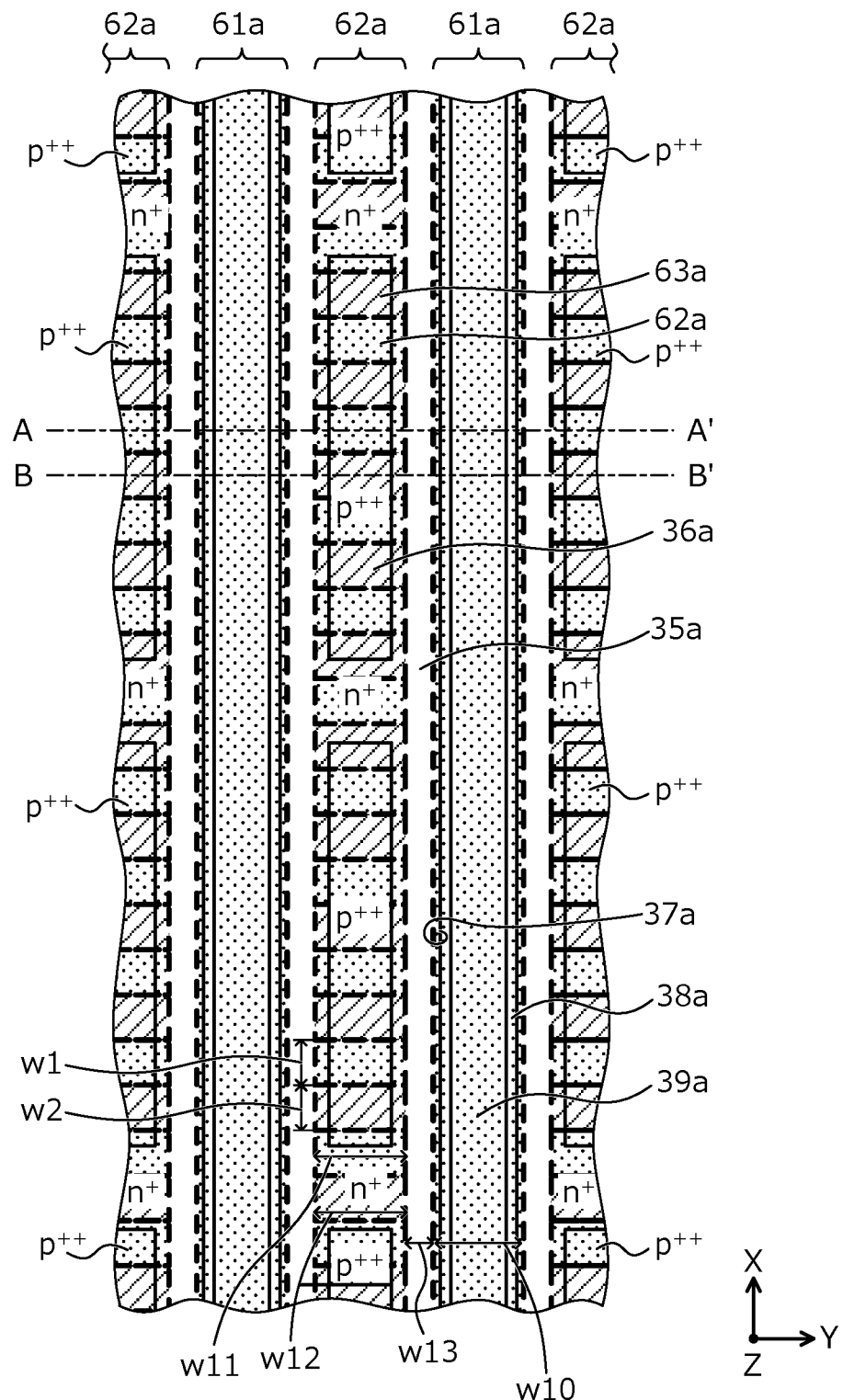
FIG. 5A is a plan view of a layout when a portion of an active region in FIG. 1 is viewed from the front side of the semiconductor substrate.
Figure 5B:
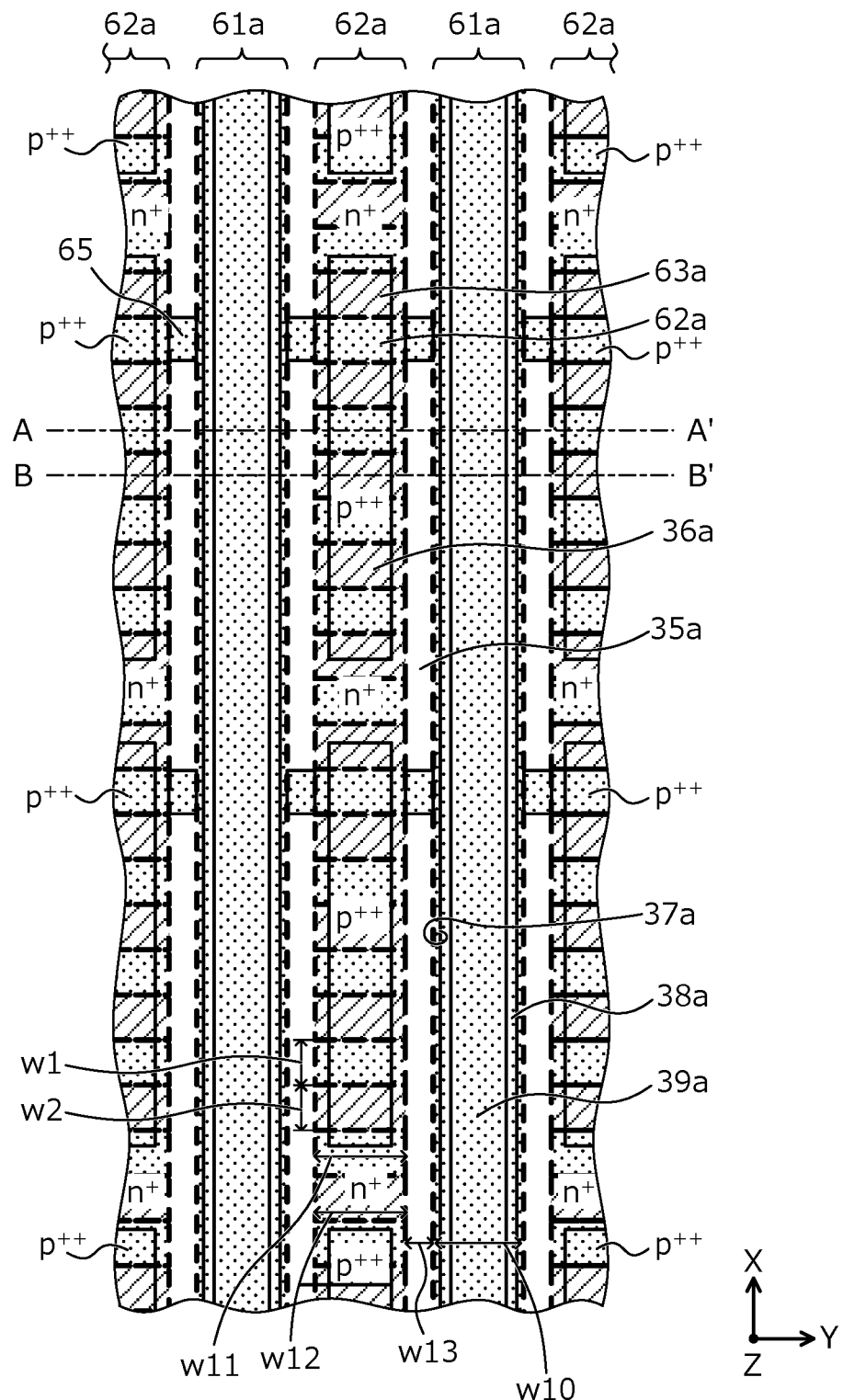
FIG. 5B is a plan view of another example of a layout when a portion of the active region in FIG. 1 is viewed from the front side of the semiconductor substrate.

A cross-sectional view of the structure of the semiconductor device 20 according to the embodiment is described. FIGS. 2, 3, and 4 are cross-sectional views of the active region in FIG. 1. FIG. 5A is a plan view of a layout when a portion of the active region depicted in FIG. 1 is viewed from the front side of the semiconductor substrate. FIG. 5B is a plan view of another example of a layout when a portion of the active region depicted in FIG. 1 is viewed from the front side of the semiconductor substrate. FIG. 2 depicts a cross-sectional view of the structure of the main effective region 1a and the current sensing portion 12 (cross-section view of the structure along cutting line X1-X2-X3-X4 in FIG. 1). FIG. 3 depicts a cross-sectional view of the structure of the main effective region 1a, the sensing effective region 12a, and the temperature sensing portion 13 (cross-sectional view of the structure along cutting line X1-X2, cutting line X3-X4, and cutting line Y1-Y2 in FIG. 1).

FIGS. 2 and 3 each depict a portion of a unit cell in the main effective region 1a and the sensing effective region 12a. In FIGS. 2 and 3, the cross-sectional view of the structure of the main effective region 1a corresponds to a cross-sectional view of the structure along cutting line A-A' in FIG. 5A. In FIGS. 2 and 3, a unit cell of the main effective region 1a, closest to the current sensing portion 12 in a second direction Y is depicted having a configuration in which an outer side of a trench 37a of an outermost periphery that is an outer peripheral portion of the main effective region 1a is free of $n^+$-type source regions 35a. Further, as depicted in FIG. 5A, a cross-sectional view of the structure in the main effective region 1a has the $n^+$-type source regions 35a between all of the trenches 37a that are adjacent to one another. FIG. 4 is a cross-sectional view of the structure along cutting line B-B' in FIG. 5A.

In FIGS. 5A and 5B, a layout of first $p^+$-type high-concentration regions 61a (first high-concentration regions: dotted-hatched portions between dashed vertical lines), second $p^+$-type high-concentration regions 62a (second high-concentration regions: dotted-hatched portions surrounded by dashed line rectangles), and $n^+$-type high-concentration regions 63a (third high-concentration regions: portions hatched with diagonal lines, surrounded by dashed line rectangles) is depicted. In FIGS. 5A and 5B, to clarify planar arrangement of the first and the second $p^+$-type high-concentration regions 61a, 62a and the $n^+$-type high-concentration regions 63a, in addition to the first and the second $p^+$-type high-concentration regions 61a, 62a and the $n^+$-type high-concentration regions 63a, the $n^+$-type source regions 35a, $p^{++}$-type contact regions 36a, and the trenches 37a, etc. are depicted.

The main semiconductor device element 11, in the main effective region 1a on the front side of the semiconductor substrate 10, has MOS gates (insulated gates having a three-layered structure including a metal, an oxide film, and a semiconductor) having a trench gate structure, configured by p-type base regions 34a, the $n^+$-type source regions 35a, the $p^{++}$-type contact regions 36a, the trenches 37a, gate insulating films 38a, and gate electrodes 39a. The semiconductor substrate 10 is formed by sequentially epitaxially growing on a front surface of an $n^+$-type starting substrate 71 containing silicon carbide, silicon carbide layers 72, 73 that form an $n^-$-type drift region (first semiconductor region) 32 and the p-type base regions (second semiconductor regions) 34a.

The $n^+$-type starting substrate 71 forms an $n^+$-type drain region 31 of the main semiconductor device element 11 and the current sensing portion 12. The semiconductor substrate 10 has a first main surface that is a surface of the p-type silicon carbide layer 73 and regarded as the front surface and a second main surface that is a surface of the $n^+$-type starting substrate 71 (back surface of the $n^+$-type starting substrate 71) and regarded as a back surface. Here, while an instance in which the main semiconductor device element 11 and a circuit portion that protects and controls the main semiconductor device element 11 have a wiring structure of a same configuration using pin-shaped wiring members (later-described terminal pins 48a to 48d) is described as an example, instead of pin-shaped wiring members, the wiring structure may use wires.

The trenches 37a penetrate through the p-type silicon carbide layer 73 from the front surface of the semiconductor substrate 10 in the depth direction Z and reach the $n^-$-type silicon carbide layer 72. The trenches 37a are disposed in a stripe shape extending in a direction parallel to the front surface of the semiconductor substrate 10 (here, the first direction X) (refer to FIG. 5A). In the trenches 37a, the gate electrodes 39a are provided via the gate insulating films 38a, respectively. The gate electrodes 39a, in the trenches 37a, extend in a linear shape in the direction in which the trenches 37a extend (the first direction X).

Between adjacent trenches 37a of the trenches 37a, in surface regions of the semiconductor substrate 10 at the front surface thereof, the p-type base regions 34a, the $n^+$-type source regions (third semiconductor regions) 35a, and the $p^{++}$-type contact regions 36a are each selectively provided. Between the front surface of the semiconductor substrate 10 and the p-type base regions 34a, the $n^+$-type source regions 35a and the $p^{++}$-type contact regions 36a are each in contact with the p-type base regions 34a. The $n^+$-type source regions 35a and the $p^{++}$-type contact regions 36a are exposed at the front surface of the semiconductor substrate 10.

The $n^+$-type source regions 35a and the $p^{++}$-type contact regions 36a being exposed at the front surface of the semiconductor substrate 10 means that the $n^+$-type source regions 35a and the $p^{++}$-type contact regions 36a are in contact with later-described NiSi films 41a in first contact holes 40a of the later-described interlayer insulating film 40. Between adjacent trenches 37a of the trenches 37a, the $n^+$-type source regions 35a and the $p^{++}$-type contact regions 36a are disposed to repeatedly alternate with one another in the first direction X that is that same direction in which the gate electrodes 39a extend.

The $n^+$-type source regions 35a are in contact with the gate insulating films 38a at sidewalls of the trenches 37a; the $p^{++}$-type contact regions 36a are in contact with the $n^+$-type source regions 35a, at positions separate from the trenches 37a. The $n^+$-type source regions 35a, between adjacent trenches 37a of the trenches 37a, form a ladder-like shape surrounding peripheries of the $p^{++}$-type contact regions 36a in a plan view thereof. Therefore, each of the $n^+$-type source regions 35a has portions that extend in the first direction X along the sidewalls of the trenches 37a and a portion that is sandwiched between the $p^{++}$-type contact regions 36a that are adjacent to each other in the first direction X.

The $p^{++}$-type contact regions 36a may be omitted. In this instance, instead of the $p^{++}$-type contact regions 36a, the p-type base regions 34a reach the front surface of the semiconductor substrate 10 and are exposed, peripheries of surface regions of the p-type base regions 34a exposed at the front surface of the semiconductor substrate 10 are surrounded by the $n^+$-type source regions 35a. In the semiconductor substrate 10, the $n^-$-type drift region 32 is provided between the p-type base regions 34a and the $n^+$-type drain region 31 (the $n^+$-type starting substrate 71), in contact with the $n^+$-type drain region 31.

Between the $n^-$-type drift region 32 and the p-type base regions 34a, n-type current spreading regions (fourth semiconductor regions) 33a may be provided in contact with the p-type base regions 34a and the $n^-$-type drift region 32. The n-type current spreading regions 33a are a so-called current spreading layer (CSL) that reduces carrier spreading resistance. Further, in the semiconductor substrate 10, at positions closer to the $n^+$-type drain region 31 than are bottoms of the trenches 37a, the first and the second $p^+$-type high-concentration regions 61a, 62a and the $n^+$-type high-concentration regions 63a are selectively provided.

The first and the second $p^+$-type high-concentration regions 61a, 62a may terminate in the n-type current spreading regions 33a on a drain side (toward the $n^+$-type drain region 31) and peripheries thereof may be surrounded by the n-type current spreading regions 33a (not depicted). The first and the second $p^+$-type high-concentration regions 61a, 62a may terminate at the same positions as the n-type current spreading regions 33a on the drain side and may be in contact with the $n^-$-type drift region 32 (not depicted). Alternatively, the first and the second $p^+$-type high-concentration regions 61a, 62a may extend further on the drain side than do the n-type current spreading regions 33a and may terminate in the $n^-$-type drift region 32 (refer to FIGS. 2 to 4).

In other words, the n-type current spreading regions 33a may be formed deeper or shallower than the first and the second $p^+$-type high-concentration regions 61a, 62a. The first and the second $p^+$-type high-concentration regions 61a, 62a terminate at substantially the same positions on the drain side. Substantially the same positions mean the same depth positions within a range including allowable error due to process variation. The first and the second $p^+$-type high-concentration regions 61a, 62a have a function of mitigating electric field applied to the trenches 37a.

In particular, during an operation state in which high electric field is applied between the drain and source, the first $p^+$-type high-concentration regions 61a mitigate the electric field applied to the bottoms of the trenches 37a. The operating state in which high electric field is applied between the drain and source is a state in which based on dynamic characteristics (breakdown voltage, reverse bias safe operating area (RBSOA), short-circuit capability), high electric field is applied near on junctions between the p-type base regions 34a and the n-type current spreading regions 33a.

The first $p^+$-type high-concentration regions 61a are provided separate from the p-type base regions 34a and face the bottoms of the trenches 37a in the depth direction Z. The first $p^+$-type high-concentration regions 61a may be exposed at the bottoms of the trenches 37a or may be disposed at positions separate from the bottoms of the trenches 37a, further on the drain side. The first $p^+$-type high-concentration regions 61a being exposed at the bottoms of the trenches 37a means that the first $p^+$-type high-concentration regions 61a are in contact with the gate insulating films 38a at the bottoms of the trenches 37a.

Further, the first $p^+$-type high-concentration regions 61a extend in a linear shape in the first direction in which the trenches 37a extend and have a length substantially equal to a length of the trenches 37a in a longitudinal direction (the first direction X) (refer to FIG. 5A). Substantially equal lengths mean equal lengths within a range including allowable error due to process variation. The first $p^+$-type high-concentration regions 61a may be electrically connected to the second $p^+$-type high-concentration regions 62a and fixed to a potential of the source pad 21a. As a result, electric field applied to the bottoms of the trenches 37a may be mitigated.

For example, in an instance in which the first $p^+$-type high-concentration regions 61a are electrically connected to the second $p^+$-type high-concentration regions 62a, as depicted in FIG. 5B, between the first and the second $p^+$-type high-concentration regions 61a, 62a, $p^+$-type regions 65 of a same depth as that of the first $p^+$-type high-concentration regions 61a are selectively provided, whereby the first and the second $p^+$-type high-concentration regions 61a, 62a that are adjacent to each another may be connected. Further, both the second $p^+$-type high-concentration regions 62a and the $n^+$-type high-concentration regions 63a may widen in the second direction Y so as to be in contact with the first $p^+$-type high-concentration regions 61a (not depicted).

By pn junction portions of the p-type base regions 34a and the n-type current spreading regions 33a, the second $p^+$-type high-concentration regions 62a handle high electric field applied between the drain and source. The second p+-type high-concentration regions 62a are provided between adjacent trenches 37a of the trenches 37a, separate from the first p+-type high-concentration regions 61a and the trenches 37a, and in contact with the p-type base regions 34a. The second p+-type high-concentration regions 62a face the first p+-type high-concentration regions 61a and the trenches 37a in the second direction Y with the n-type current spreading regions 33a intervening therebetween.

The second p+-type high-concentration regions 62a are scattered along the first direction X, which is the direction in which the trenches 37a extend (refer to FIG. 5A). In other words, the second p+-type high-concentration regions 62a are disposed partially reduced in number as compared to the conventional structure (refer to reference character 162a in FIG. 22). Portions where the second p+-type high-concentration regions 62a are reduced in number are free of JFET regions. Therefore, the greater is the number of portions where the second p+-type high-concentration regions 62a are reduced in number, the lower is the JFET resistance of the main semiconductor device element 11 as compared to the conventional structure. The second p+-type high-concentration regions 62a, for example, has a substantially rectangular shape in a plan view thereof.

A width w1 of the second p+-type high-concentration regions 62a in the first direction X, for example, is at least about 3 µm, a processing limit value for ion implantation. The width w1 of the second p+-type high-concentration regions 62a in the first direction X, for example, may be narrower than a width w11 of the second p+-type high-concentration regions 62a in the second direction Y. A p-type impurity concentration of the second p+-type high-concentration regions 62a is in a range from $5 \times 10^{17}/cm^3$ to $5 \times 10^{19}/cm^3$. Further, the p-type impurity concentration of the second p+-type high-concentration regions 62a may be substantially equal to a p-type impurity concentration of the first p+-type high-concentration regions 61a. Substantially equal impurity concentrations mean equal impurity concentrations within a range including allowable error due to process variation, an error of ±10% being the allowable range.

The n+-type high-concentration regions 63a are provided between adjacent trenches 37a of the trenches 37a, separate from the first p+-type high-concentration regions 61a and the trenches 37a, and in contact with the p-type base regions 34a. The n+-type high-concentration regions 63a are adjacent to the second p+-type high-concentration regions 62a in the first direction X and adjacent to the n-type current spreading regions 33a in the second direction Y. Preferably, an entire area of a surface of each of the n+-type high-concentration regions 63a may be in contact with a respective one of the second p+-type high-concentration regions 62a in the first direction X and an entire area of a surface of each of the n+-type high-concentration regions 63a may be in contact with a respective one of the n-type current spreading regions 33a in the second direction Y. The n+-type high-concentration regions 63a face the first p+-type high-concentration regions 61a and the trenches 37a in the second direction Y with the n-type current spreading regions 33a intervening therebetween.

In particular, the n+-type high-concentration regions 63a are respectively provided between adjacent second p+-type high-concentration regions 62a of the second p+-type high-concentration regions 62a in the first direction X, adjacently to these second p+-type high-concentration regions 62a. Preferably, the second p+-type high-concentration regions 62a and the n+-type high-concentration regions 63a may be disposed to repeatedly alternate with one another in the first direction X and the second p+-type high-concentration regions 62a may be disposed outermost along the first direction X. By all of the second p+-type high-concentration regions 62a and the n+-type high-concentration regions 63a adjacent to one another in the first direction X, a linear portion having a length in the first direction X substantially equal to the length of the trenches 37a in the longitudinal direction may be formed.

The n+-type high-concentration regions 63a terminate at substantially the same positions on the drain side as the first and the second p+-type high-concentration regions 61a, 62a. The n+-type high-concentration regions 63a, for example, have a substantially rectangular shape in a plan view thereof. A width w2 of the n+-type high-concentration regions 63a in the first direction X, for example, is at least about 3 µm, a processing limit value for ion implantation and may be substantially a same measurement as the width w1 of the second p+-type high-concentration regions 62a in the first direction X. The widths being substantially the same means the widths are the same within a range including allowable error due to process variation, an error of ±10% being the allowable range.

Preferably, the width w2 of the n+-type high-concentration regions 63a in the first direction X may be at least a width w13 between the first and the second p+-type high-concentration regions 61a, 62a adjacent to one another. An n-type impurity concentration of the n+-type high-concentration regions 63a is in a range from $5 \times 10^{17}/cm^3$ to $5 \times 10^{19}/cm^3$. Further, an n-type impurity concentration of the n+-type high-concentration regions 63a is higher than an n-type impurity concentration of the n-type current spreading regions 33a and preferably, may be substantially equal to the p-type impurity concentration of the first and the second p+-type high-concentration regions 61a, 62a. Herein, substantially equal means equal impurity concentrations within a range including allowable error due to process variation, an error of ±10% being the allowable range. The widths w10, w11 of the first and the second p+-type high-concentration regions 61a, 62a in the second direction Y and the width w12 of the n+-type high-concentration regions 63a in the second direction Y are substantially a same measurement. Herein, substantially the same means the same widths in a range including allowable error due to process variation, an error of ±10% being the allowable range.

The n+-type high-concentration regions 63a are provided under the conditions above, whereby application of high electric field to the bottoms of the trenches 37a may be suppressed and resistance may be reduced. In particular, in an operation state in which high electric field is applied between the drain and source, when pn junctions between the first and the second p+-type high-concentration regions 61a, 62a, the n-type current spreading regions 33a, the n+-type high-concentration regions 63a, and the n−-type drift region 32 are reversed biased, a width (width in a direction orthogonal to the pn junctions) of a depletion layer that spreads in the n+-type high-concentration regions 63a, from the pn junctions between the second p+-type high-concentration regions 62a and the n+-type high-concentration regions 63a is narrower than a width of a depletion layer that spreads in the n-type current spreading regions 33a and the n−-type drift region 32, from the pn junctions between the first and the second p+-type high-concentration regions 61a, 62a, the n-type current spreading regions 33a, and the n−-type drift region 32.

As a result, avalanche breakdown occurs at the pn junctions between the second $p^+$-type high-concentration regions 62a and the $n^+$-type high-concentration regions 63a for which the width of the depletion layer is relatively narrow, thereby enabling stable concentration of electric field at the pn junctions between the second $p^+$-type high-concentration regions 62a and the $n^+$-type high-concentration regions 63a. Therefore, application of high electric field to the bottoms of the trenches 37a may be suppressed. Further, as described above, no JFET region is formed in portions where the second $p^+$-type high-concentration regions 62a are reduced in number. In addition, the $n^+$-type high-concentration regions 63a are disposed in the portions where the second $p^+$-type high-concentration regions 62a are reduced in number, whereby the depletion layer does not spread easily in portions of the n-type current spreading regions 33a between the first $p^+$-type high-concentration regions 61a and the $n^+$-type high-concentration regions 63a and a path of current that passes through the channel is widened. As a result, the ON resistance is reduced due to JFET resistance being reduced.

The interlayer insulating film 40 is provided in substantially an entire area of the front surface of the semiconductor substrate 10 and covers the gate electrodes 39a in the main effective region 1a. The gate electrodes 39a of all of the unit cells are electrically connected to the gate pad 21b (refer to FIG. 1). In the main effective region 1a, the first contact holes 40a that penetrate through the interlayer insulating film 40 in the depth direction Z are provided. In the first contact holes 40a, the $n^+$-type source regions 35a and the $p^{++}$-type contact regions 36a are exposed.

In the first contact holes 40a, the nickel silicide (NiSi, $Ni_2Si$, or thermally stable $NiSi_2$, collectively "NiSi") films 41a are in ohmic contact with the semiconductor substrate 10 and are electrically connected to the $n^+$-type source regions 35a and the $p^{++}$-type contact regions 36a. In an instance in which the $p^{++}$-type contact regions 36a are not provided, instead of the $p^{++}$-type contact regions 36a, the p-type base regions 34a are exposed in the first contact holes 40a and are electrically connected to the NiSi films 41a.

In an entire area of the surface of the interlayer insulating film 40 and entire areas of the surfaces of the NiSi films 41a in the main effective region 1a, a barrier metal 46a is provided along the surfaces of the interlayer insulating film 40 and the NiSi films 41a. The barrier metal 46a has a function of preventing interaction between metal films of the barrier metal 46a and interaction between regions facing each other across the barrier metal 46a. The barrier metal 46a, for example, may have a layered structure in which a first titanium nitride (TiN) film 42a, a first titanium (Ti) film 43a, a second TiN film 44a, and a second Ti film 45a are sequentially stacked.

The first TiN film 42a covers an entire area of the surface of the interlayer insulating film 40. The first TiN film 42a is not provided on the front surface of the semiconductor substrate 10 in portions thereof where the NiSi films 41a is formed. The first Ti film 43a is provided on the surface of the first TiN film 42a and on the surfaces of the NiSi films 41a. The second TiN film 44a is provided on the surface of the first Ti film 43a. The second Ti film 45a is provided on the surface of the second TiN film 44a. The source pad 21a is provided in an entire area of the surface of the second Ti film 45a.

The source pad 21a is electrically connected to the $n^+$-type source regions 35a and the $p^{++}$-type contact regions 36a via the barrier metal 46a and the NiSi films 41a. The source pad 21a, for example, may be an aluminum (Al) film, an aluminum-silicon (Al—Si) film, or an aluminum-silicon-copper (Al—Si—Cu) film having a thickness of about 5 μm. The source pad 21a, the barrier metal 46a, and the NiSi films 41a function as a source electrode of the main semiconductor device element 11.

A first end of each of the terminal pins 48a is bonded on the source pad 21a, via plating films 47a and a solder layer (not depicted). A second end of each of the terminal pins 48a is bonded to a metal bar (not depicted) disposed so as to face the front surface of the semiconductor substrate 10. Further, the second end of each of the terminal pins 48a is exposed outside a case (not depicted) in which the semiconductor substrate 10 is mounted, the second ends being electrically connected to an external device (not depicted). The terminal pins 48a are soldered to the plating films 47a in a substantially upright state with respect to the front surface of the semiconductor substrate 10.

The terminal pins 48a are wiring members having a round, rod-like shape (cylinder shape) having a predetermined diameter and are connected to an external ground potential (minimum electric potential). The terminal pins 48a are external connection terminals that lead out the potential of the source pad 21a. First and second protective films 49a, 50a, for example, are polyimide films. Portions of the surface of the source pad 21a other than portions having the plating films 47a are covered by first protective films 49a. Borders between the plating films 47a and the first protective films 49a are covered by second protective films 50a.

A drain electrode 51 is in ohmic contact with an entire area of the back surface of the semiconductor substrate 10 (back surface of the $n^+$-type starting substrate 71). On the drain electrode 51, a drain pad (electrode pad, not depicted) having a stacked structure in which, for example, a Ti film, a nickel (Ni) film, and a gold (Au) film are sequentially stacked is provided. The drain pad is soldered to a metal base plate (not depicted) of an insulated substrate, the metal plate being formed by, for example, a copper foil, and at least a portion of the drain pad is in contact with a base portion of a cooling fin (not depicted) via the metal base plate.

In this manner, the terminal pins 48a are bonded to the source pad 21a on the front surface of the semiconductor substrate 10 and the drain pad of the back surface is bonded to the metal base plate of the insulated substrate, whereby a double-sided cooling structure in which a cooling structure is provided on both sides of the semiconductor substrate 10 is formed. Heat generated by the semiconductor substrate 10 is radiated from a fin portion of the cooling fin via the metal base plate bonded to the drain pad at the back surface of the semiconductor substrate 10 and is radiated from the metal bar to which the terminal pins 48a of the front surface of the semiconductor substrate 10 are bonded.

The current sensing portion 12 includes the p-type base region 34b, $n^+$-type source regions 35b, $p^{++}$-type contact regions 36b, trenches 37b, gate insulating films 38b, gate electrodes 39b, and the interlayer insulating film 40 respectively having configurations similar to configurations of corresponding parts of the main semiconductor element 11. Parts of the MOS gates of the current sensing portion 12 are provided in the sensing effective region 12a of the main non-operating region 1b. The p-type base region 34b is apart from the p-type base regions 34a of the main semiconductor device element 11 with an $n^-$-type region 32a of the semiconductor substrate 10 at the front surface thereof intervening therebetween.

The p-type base region 34b, for example, extends in substantially an entire area of the main non-operating region 1b, from the sensing effective region 12a. The current sensing portion 12 may have the n-type current spreading regions 33b and first and second p$^+$-type high-concentration regions 61b, 62b. In this instance, the n-type current spreading regions 33b and the first p$^+$-type high-concentration regions 61b are disposed similarly as corresponding regions in the main semiconductor device element 11. The second p$^+$-type high-concentration regions 62b may be scattered in the first direction X similarly as corresponding regions in the main semiconductor device element 11 or may extend in a linear shape in the first direction X like those in a conventional structure (refer to reference numeral 262 in FIG. 22).

In an instance in which the second p$^+$-type high-concentration regions 62b are scattered in the first direction X, between adjacent second p$^+$-type high-concentration regions 62b of the second p$^+$-type high-concentration regions 62b, similarly to the main semiconductor device element 11, n$^+$-type high-concentration regions are disposed. The p$^{++}$-type contact regions 36b may be omitted. In this instance, similarly to the main semiconductor device element 11, instead of the p$^{++}$-type contact regions 36b, the p-type base region 34b is exposed at the front surface of the semiconductor substrate 10. The gate electrodes 39b of all of the unit cells are electrically connected to the gate pad 21b (refer to FIG. 1). The interlayer insulating film 40 covers the gate electrodes 39b.

In the sensing effective region 12a, second contact holes 40b that penetrate through the interlayer insulating film 40 in the depth direction Z and reach the semiconductor substrate 10 are provided, whereby the n$^+$-type source regions 35b and the p$^{++}$-type contact regions 36b are exposed. In the sensing effective region 12a, on the front surface of the semiconductor substrate 10, similarly to the main semiconductor device element 11, NiSi films 41b and a barrier metal 46b are provided. Reference characters 42b, 43b, 44b, and 45b are respectively a first TiN film, a first Ti film, a second TiN film, and a second Ti film that configure the barrier metal 46b.

In the second contact holes 40b, the NiSi films 41b are in ohmic contact with the semiconductor substrate 10 and are electrically connected to the n$^+$-type source regions 35b and the p$^{++}$-type contact regions 36b. In an instance in which the p$^{++}$-type contact regions 36b are omitted, instead of the p$^{++}$-type contact regions 36b, the p-type base region 34b is exposed in the second contact holes 40b and electrically connected to the NiSi films 41b. The barrier metal 46b extends on the interlayer insulating film 40 in the sensing non-operating region 12b.

In an entire area of the surface of the barrier metal 46b, the OC pad 22 is provided separate from the source pad 21a. The OC pad 22 is electrically connected to the n$^+$-type source regions 35b and the p-type base region 34b via the barrier metal 46b and the NiSi films 41b. The OC pad 22, for example, is formed concurrently with the source pad 21a, using a same material as that of the source pad 21a. The OC pad 22, the barrier metal 46b, and the NiSi films 41b function as a source electrode of the current sensing portion 12.

On the OC pad 22, the terminal pins 48b are bonded by a wiring structure similar to the wiring structure on the source pad 21a. The terminal pins 48b are wiring members having a round, rod-like shape (cylinder shape) having a diameter smaller than the diameter of the terminal pins 48a. The terminal pins 48b, for example, are external connection terminals that lead electric potential of the OC pad 22 out of the device and connect the OC pad 22 to a ground potential via an external resistor (not depicted). Reference characters 47b, 49b, and 50b are respectively plating films, first protective films, and second protective films configuring the wiring structure on the OC pad 22.

The p-type base regions 34a of the main effective region 1a and the p-type base region 34b of the sensing effective region 12a are separated from a p-type region (not depicted) for device element isolation, by a non-depicted n$^-$-type region in a surface region of the semiconductor substrate 10. The p-type region for device isolation is provided in the edge termination region 2, in a substantially rectangular shape surrounding a periphery of the active region and is a floating p-type region that forms a pn junction with the n$^-$-type drift region 32 and thereby, forms parasitic diode electrically isolating the active region 1 and the edge termination region 2.

The temperature sensing portion 13, for example, is a polysilicon diode formed by a pn junction between a p-type polysilicon layer 81 that is a p-type anode region and an n-type polysilicon layer 82 that is an n-type cathode region (FIG. 3). The p-type polysilicon layer 81 and the n-type polysilicon layer 82 are provided on the interlayer insulating film 40, in the main non-operating region 1b. The temperature sensing portion 13 is electrically insulated from the semiconductor substrate 10, the main semiconductor device element 11, and the current sensing portion 12 by the interlayer insulating film 40.

The anode pad 23a and the cathode pad 23b are respectively in contact with the p-type polysilicon layer 81 and the n-type polysilicon layer 82 in third and fourth contact holes 83a, 83b of an interlayer insulating film 83 covering the anode pad 23a and the cathode pad 23b. The anode pad 23a and the cathode pad 23b, for example, are formed concurrently with the source pad 21a, using a same material as that of the source pad 21a. On the anode pad 23a and on the cathode pad 23b, the terminal pins 48c, 48d are respectively bonded by a wiring structure similar to the wiring structure on the source pad 21a.

The terminal pins 48c, 48d are external connection terminals that lead out potential of the anode pad 23a and the cathode pad 23b, respectively, and are wiring members having a round, rod-like shape having a predetermined diameter corresponding to the current capability of the temperature sensing portion 13. Reference characters 47c and 47d are plating films forming the wiring structure on the anode pad 23a and the wiring structure on the cathode pad 23b, respectively. Reference characters 49c and 50c are respectively first and second protective films configuring the wiring structure on the temperature sensing portion 13. In the temperature sensing portion 13, the barrier metal is not provided.

Further, in the main non-operating region 1b, a gate pad portion 14 is provided in which the gate pad 21b of the main semiconductor device element 11 is disposed (refer to FIG. 1). The gate pad 21b is provided on the interlayer insulating film 40 in the main non-operating region 1b, separate from the other electrode pads. The gate pad 21b, for example, is formed concurrently with the source pad 21a using a same material as that of the source pad 21a. On the gate pad 21b, terminal pins (not depicted) are bonded by a wiring structure similar to the wiring structure on the source pad 21a.

Operation of the semiconductor device 20 according to the embodiment is described. In a state in which voltage that is positive with respect to the source electrode (the source pad 21a) of the main semiconductor device element 11 (forward voltage) is applied to the drain electrode 51, when voltage at least equal to a gate threshold voltage is applied to the gate electrodes 39a of the main semiconductor device element 11, a channel (n-type inversion layer) is formed by portions of the p-type base regions 34a along the trenches 37a in the main semiconductor device element 11. As a result, current that passes through the channel from the n$^+$-type drain region 31 of the main semiconductor device element 11 flows toward the n$^+$-type source regions 35a and the main semiconductor device element 11 turns ON.

In the path of the current that passes through the channel, even when the width (the width w13) of portions of the n-type current spreading regions 33a between adjacent first and the second p$^+$-type high-concentration regions 61a, 62a of the first and the second p$^+$-type high-concentration regions 61a, 62a becomes narrower due to unit cell miniaturization, the second p$^+$-type high-concentration regions 62a are disposed partially reduced in number, whereby JFET resistance decreases. Further, in the current path, in portions of the n-type current spreading regions 33a between the first p$^+$-type high-concentration regions 61a and the n$^+$-type high-concentration regions 63a adjacent to one another, the depletion layer does not spread easily and therefore, the current path becomes wider than the portions of the n-type current spreading regions 33a between the first p$^+$-type high-concentration regions 61a and the n$^+$-type high-concentration regions 63a adjacent to one another and the JFET resistance is reduced.

Under the same conditions as those of the main semiconductor device element 11, in a state in which voltage that is positive with respect to the source electrode (the OC pad 22) of the current sensing portion 12 (forward voltage) is applied to the drain electrode 51, when voltage at least equal to the gate threshold voltage is applied to the gate electrodes 39b of the current sensing portion 12, a channel (n-type inversion layer) is formed by portions of the p-type base region 34b along the trenches 37b in the current sensing portion 12. As a result, current from the n$^+$-type drain region 31 of the current sensing portion 12 toward the n$^+$-type source regions 35b (hereinafter, sensing current) flows and the current sensing portion 12 turns ON.

When the main semiconductor device element 11 is ON, the current sensing portion 12 is assumed to be ON. The sensing current flows in the current sensing portion 12, whereby voltage drop occurs at a resistor (not depicted) connected between a grounding point and the n$^+$-type source regions 35b of the current sensing portion 12. The sensing current of the current sensing portion 12 increases according to the magnitude of the current flowing in the main semiconductor device element 11 and therefore, the voltage drop at the resistor also increases. Therefore, by monitoring the magnitude of the voltage drop at the resistor, overcurrent in the main semiconductor device element 11 may be detected.

On the other hand, when voltage less than the gate threshold voltage is applied to the gate electrodes 39a, the pn junctions between the first and the second p$^+$-type high-concentration regions 61a, 62a, the p-type base regions 34a, the n-type current spreading regions 33a, the n$^+$-type high-concentration regions 63a, and the n$^-$-type drift region 32 are reverse biased, whereby the main semiconductor device element 11 maintains the OFF state. The voltage that is less than the gate threshold voltage is further applied to the gate electrodes 39b of the current sensing portion 12, and the pn junctions between the first and the second p$^+$-type high-concentration regions 61b, 62b, the p-type base region 34b, the n-type current spreading regions 33b, and the n$^-$-type drift region 32 are reversed biased, whereby the current sensing portion 12 maintains the OFF sate.

The pn junctions between the first and the second p$^+$-type high-concentration regions 61a, 62a, the n-type current spreading regions 33a, the n$^+$-type high-concentration regions 63a, and the n$^-$-type drift region 32 are positioned further on the drain side than are the bottoms of the trenches 37a, whereby electric field applied to the bottoms of the trenches 37a when the main semiconductor device element 11 is OFF is mitigated. Further, as described above, in an operation state in which high electric field is applied between the drain and source, avalanche current occurs at the pn junctions between the second p$^+$-type high-concentration regions 62a and the n$^+$-type high-concentration regions 63a and therefore, application of high electric field to the bottoms of the trenches 37a may be suppressed.

Similarly to the main semiconductor device element 11, the current sensing portion 12 has the first and the second p$^+$-type high-concentration regions 61b, 62b, whereby electric field applied to the bottoms of the trenches 37b in the OFF state is mitigated. Further, similarly to the main semiconductor device element 11, in an instance in which the current sensing portion 12 is an n$^+$-type high-concentration region, similarly to the main semiconductor device element 11, in an operation state in which high electric field is applied between the drain and source, application of high electric field to the bottoms of the trenches 37b may be suppressed.

Further, when the main semiconductor device element 11 is OFF, by applying voltage that is negative with respect to the source electrode (the source pad 21a) to the drain electrode 51, current may be passed in a forward direction through a parasitic diode formed by the pn junctions between the first and the second p$^+$-type high-concentration regions 61a, 62a, the n-type current spreading regions 33a, and the n$^-$-type drift region 32. For example, this parasitic diode built into the semiconductor substrate 10 may be used as a freewheeling diode for protecting the main semiconductor device element 11 itself.

During operation of the main semiconductor device element 11, in the temperature sensing portion 13, normally, from the anode pad 23a, forward current continuously flows through pn junctions between an anode region (the p-type polysilicon layer 81) and a cathode region (the n-type polysilicon layer 82) to the cathode pad 23b. A curve indicating a relationship between forward current If and forward voltage Vf of the temperature sensing portion 13 (forward voltage characteristics) is dependent on temperature, and the higher is the temperature, the smaller is the forward voltage Vf. Thus, forward voltage characteristics of the temperature sensing portion 13 are obtained in advance and, for example, are stored to a storage unit (not depicted).

During operation of the main semiconductor device element 11, for example, the forward voltage Vf (voltage drops at the temperature sensing portion 13) that occurs between the anode pad 23a and the cathode pad 23b of the temperature sensing portion 13 at a normal temperature (for example, about 25 degrees C.) is monitored continuously by the arithmetic circuit portion. When the forward voltage Vf of the temperature sensing portion 13 drops, a high-temperature portion is assumed to occur in the main semiconductor device element 11 (the semiconductor substrate 10) and by the arithmetic circuit portion, the supply of gate voltage to the main semiconductor device element 11 is suspended, thereby suspending operation of the main semiconductor device element 11.

Next, a method of manufacturing the semiconductor device 20 according to the embodiment is described. FIGS. 6, 7, 8, 9, 10, 11, 12, 13, 14, 15, and 16 are cross-sectional views depicting states of the semiconductor device according to the embodiment during manufacture. FIGS. 6, 7, 9, 11, 13, and 15 depict cross-sectional views of the state of the structure of the main semiconductor device element 11 along cutting line A-A' in FIG. 5A, during manufacture. FIGS. 6, 8, 10, 12, and 14 depict cross-sectional views of the state of the structure of the main semiconductor device element 11 along cutting line B-B' in FIG. 5A, during manufacture.

Figure 6:
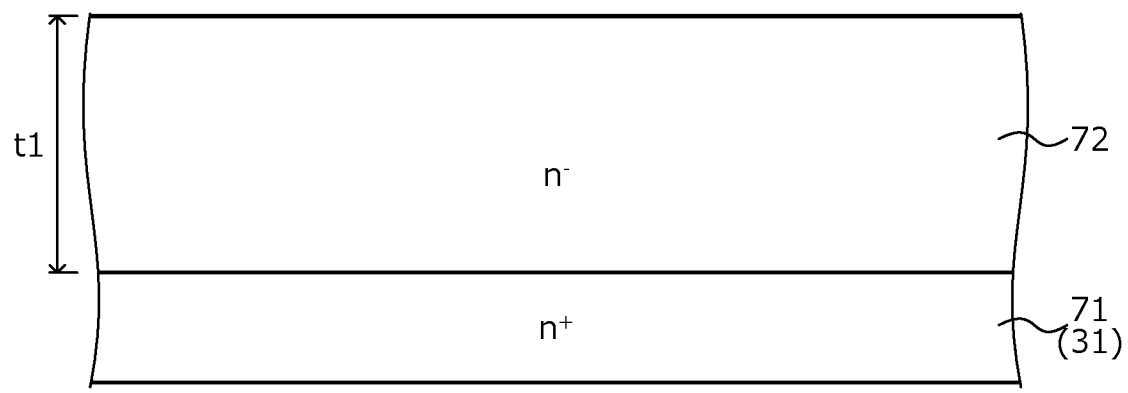
FIG. 6 is a cross-sectional view depicting a state of the semiconductor device according to the embodiment during manufacture.

First, as depicted in FIG. 6, for example, a silicon carbide single crystal substrate doped with nitrogen (N) is prepared as the $n^+$-type starting substrate (semiconductor wafer) 71 containing silicon carbide. Next, the $n^-$-type silicon carbide layer 72 doped with a lower concentration of nitrogen than is the $n^+$-type starting substrate 71 is epitaxially grown on the front surface of the $n^+$-type starting substrate 71. In an instance in which the main semiconductor device element 11 has a breakdown voltage of 3300V, a thickness t1 of the $n^-$-type silicon carbide layer 72, for example, may be about 30 µm.

Figure 7:
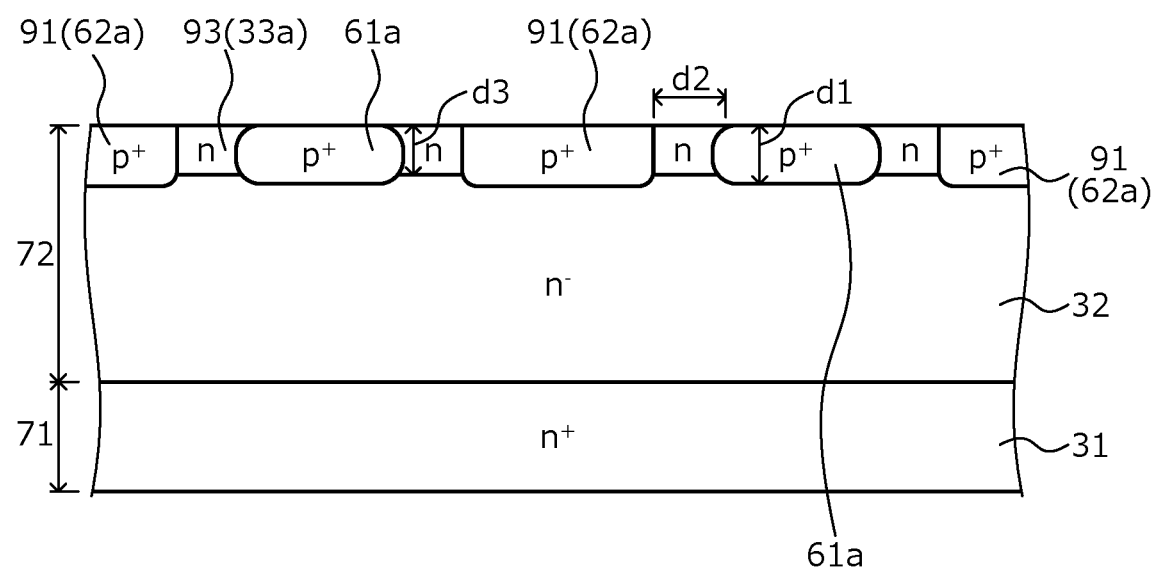
FIG. 7 is a cross-sectional view depicting a state of the semiconductor device according to the embodiment during manufacture.

Next, as depicted in FIG. 7, by photolithography and, for example, ion implantation of a p-type impurity such as Al, in the main effective region 1a, in the $n^-$-type silicon carbide layer 72 at a surface thereof, the first $p^+$-type high-concentration regions 61a and $p^+$-type high-concentration regions 91 are selectively formed. The first $p^+$-type high-concentration regions 61a and the $p^+$-type high-concentration regions 91 are disposed to repeatedly alternate one another in the second direction Y (refer to FIG. 5A). The $p^+$-type high-concentration regions 91 are disposed periodically at a predetermined interval, along the first direction X (refer to FIG. 5A).

Figure 8:
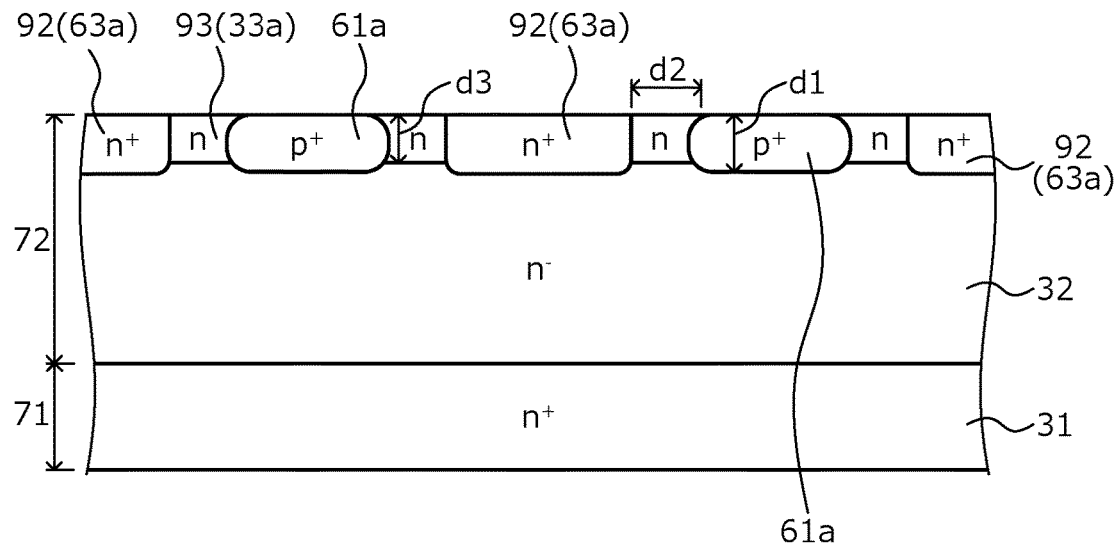
FIG. 8 is a cross-sectional view depicting a state of the semiconductor device according to the embodiment during manufacture.

Next, as depicted in FIG. 8, by photolithography and, for example, ion implantation of an n-type impurity such as nitrogen, in the main effective region 1a, in surface regions of the $n^-$-type silicon carbide layer 72, $n^+$-type high-concentration regions 92 are selectively formed. The $n^+$-type high-concentration regions 92 are formed between the $p^+$-type high-concentration regions 91 that adjacent to one another in the first direction X, the $n^+$-type high-concentration regions 92 being in contact with the $p^+$-type high-concentration regions 91. As a result, the $p^+$-type high-concentration regions 91 and the $n^+$-type high-concentration regions 92 are disposed to repeatedly alternate with one another in the first direction X.

Next, by photolithography and, for example, ion implantation of an n-type impurity such as nitrogen, in an entire area of the main effective region 1a, n-type regions 93 are formed in surface regions of the $n^-$-type silicon carbide layer 72 (FIGS. 7, 8). The n-type regions 93 are formed between the first $p^+$-type high-concentration regions 61a and the $p^+$-type high-concentration regions 91, and between the first $p^+$-type high-concentration regions 61a and the $n^+$-type high-concentration regions 92. A portion of the $n^-$-type silicon carbide layer 72 free of ion implantation constitutes the $n^-$-type drift region 32. A formation sequence of the n-type regions 93, the $p^+$-type high-concentration regions 61a, 91, and the $n^+$-type high-concentration regions 92 may be interchanged.

A distance d2 between the $p^+$-type high-concentration regions 61a, 91 adjacent to another other (corresponds to the width w13 in FIG. 5A), for example, is about 1.5 µm. A depth d1 of the $p^+$-type high-concentration regions 61a, 91 and the $n^+$-type high-concentration regions 92, for example, is about 0.5 µm. A p-type impurity concentration of the $p^+$-type high-concentration regions 61a, 91, for example, is about $5.0×10^{18}/cm^3$. An n-type impurity concentration of the $n^+$-type high-concentration regions 92 is higher than an n-type impurity concentration of the n-type regions 93. A depth d3 and the n-type impurity concentration of the n-type regions 93, for example, are about 0.4 µm and about $1.0×10^{17}/cm^3$, respectively.

Figure 9:
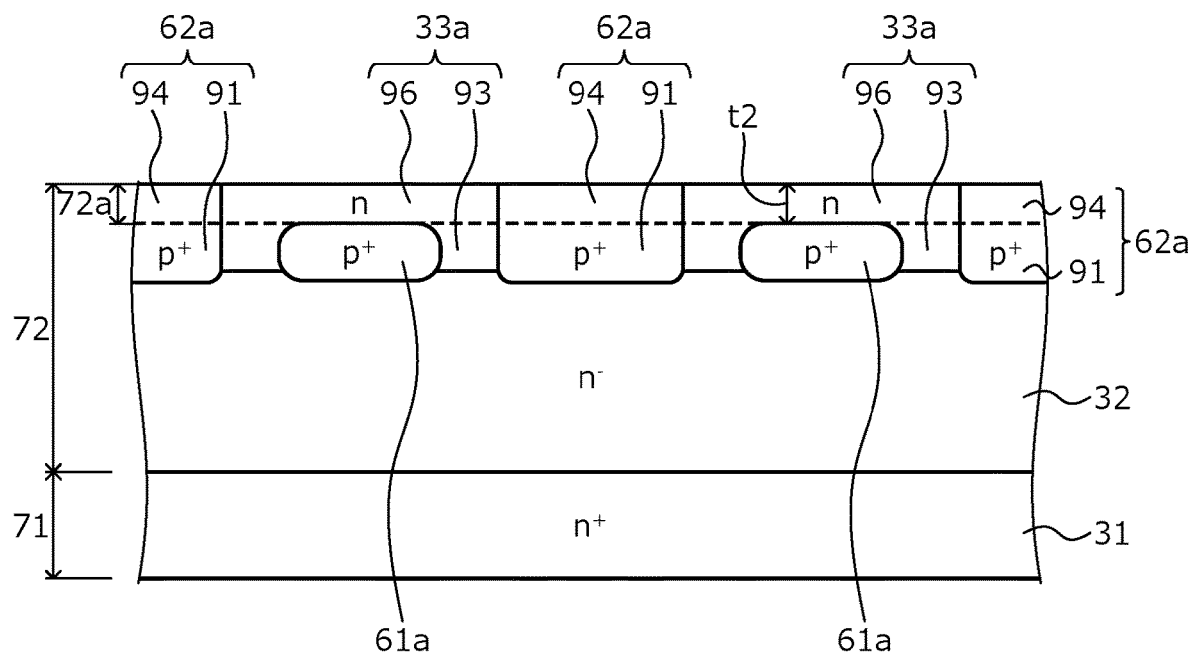
FIG. 9 is a cross-sectional view depicting a state of the semiconductor device according to the embodiment during manufacture.
Figure 10:
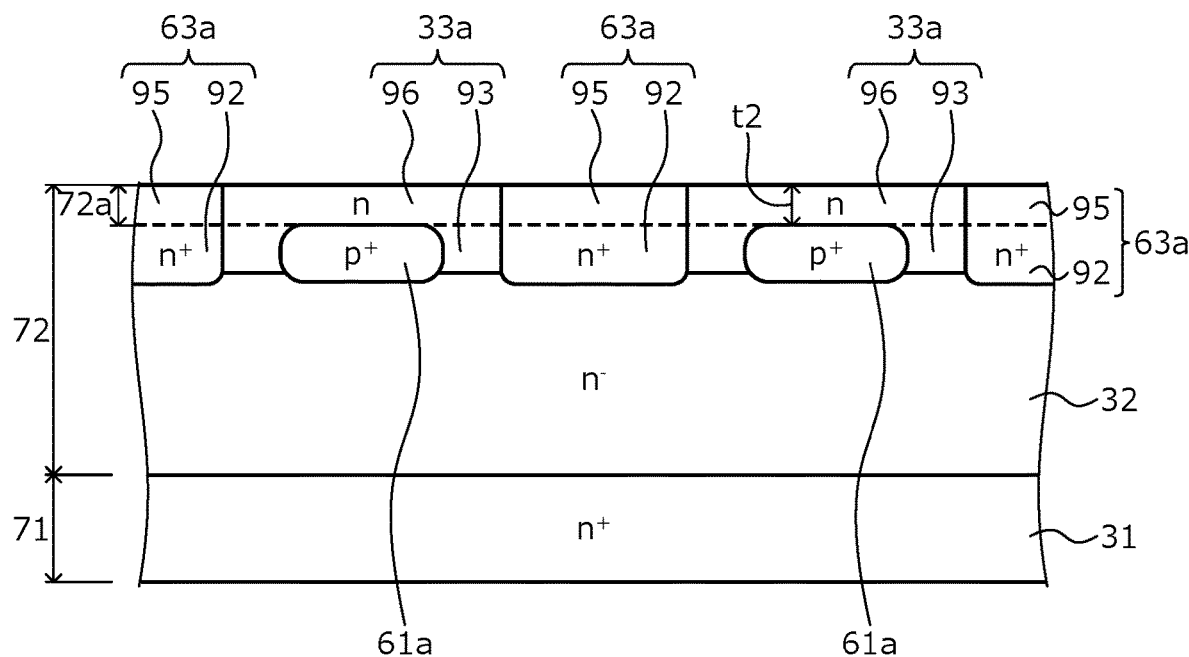
FIG. 10 is a cross-sectional view depicting a state of the semiconductor device according to the embodiment during manufacture.

Next, as depicted in FIGS. 9 and 10, on the $n^-$-type silicon carbide layer 72, an $n^-$-type silicon carbide layer doped with, for example, an n-type impurity such as nitrogen is epitaxially grown having, for example, a thickness t2 of about 0.5 µm, thereby increasing the thickness of the $n^-$-type silicon carbide layer 72. As a result, the thickness of the $n^-$-type silicon carbide layer 72 becomes a predetermined thickness. An n-type impurity concentration of a portion 72a by which the thickness of the $n^-$-type silicon carbide layer 72 is increased, for example, may be $3×10^{15}/cm^3$.

Next, by photolithography and, for example, ion implantation of a p-type impurity such as Al, in the portion 72a by which the thickness of the $n^-$-type silicon carbide layer 72 is increased, $p^+$-type high-concentration regions 94 reaching the $p^+$-type high-concentration regions 91 are formed (FIG. 9). Next, by photolithography and, for example, ion implantation of an n-type impurity such as nitrogen, in the portion 72a by which the thickness of the $n^-$-type silicon carbide layer 72 is increased, $n^+$-type high-concentration regions 95 reaching the $n^+$-type high-concentration regions 92 are selectively formed (FIG. 10).

Next, by photolithography and, for example, ion implantation of an n-type impurity such as nitrogen, in the portion 72a by which the thickness of the $n^-$-type silicon carbide layer 72 is increased, n-type regions 96 reaching the n-type regions 93 are selectively formed (FIGS. 9, 10). As a result, the $p^+$-type high-concentration regions 91, 94 adjacent to one another in the depth direction Z are connected, whereby the second $p^+$-type high-concentration regions 62a are formed. The $n^+$-type high-concentration regions 92, 95 adjacent to one another in the depth direction Z are connected, whereby the $n^+$-type high-concentration regions 63a are formed.

The n-type regions 93, 96 adjacent to one another in the depth direction Z are connected, whereby the n-type current spreading regions 33a are formed. Conditions such as impurity concentrations of the $p^+$-type high-concentration regions 94, the $n^+$-type high-concentration regions 95, and the n-type regions 96, for example, are equal to those of the $p^+$-type high-concentration regions 91, the $n^+$-type high-concentration regions 92, and the n-type regions 93, respectively. A formation sequence of the $p^+$-type high-concentration regions 94, the $n^+$-type high-concentration regions 95, and the n-type regions 96 may be interchanged.

Figure 11:
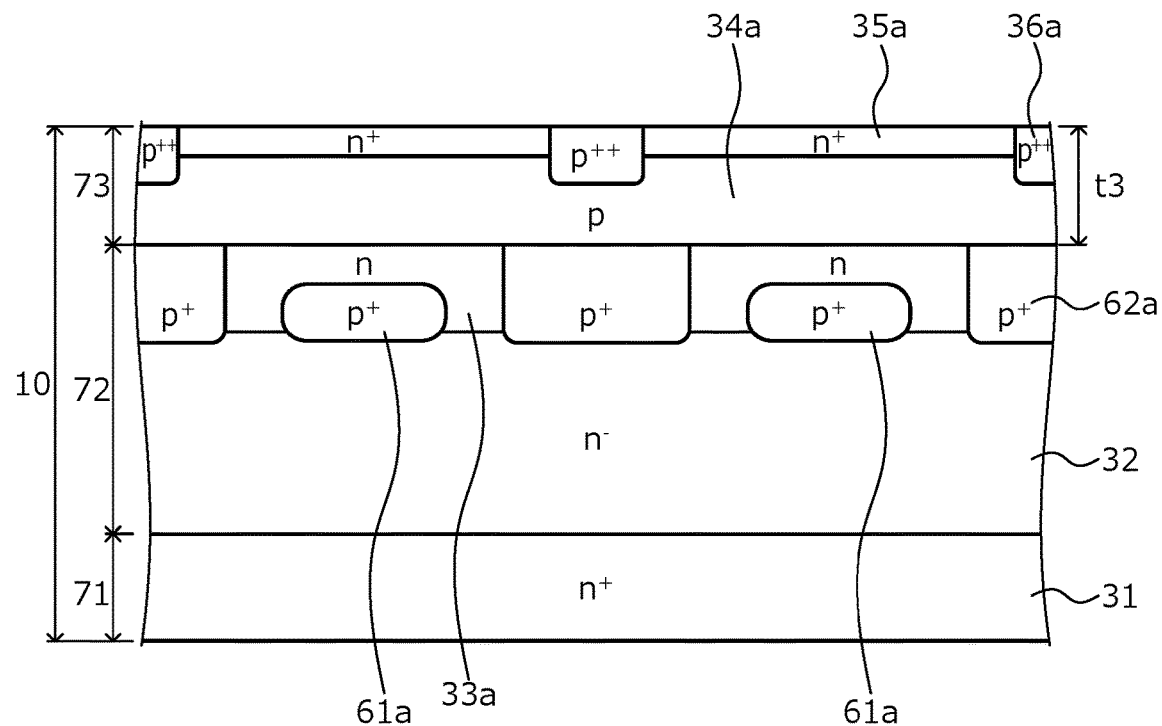
FIG. 11 is a cross-sectional view depicting a state of the semiconductor device according to the embodiment during manufacture.
Figure 12:
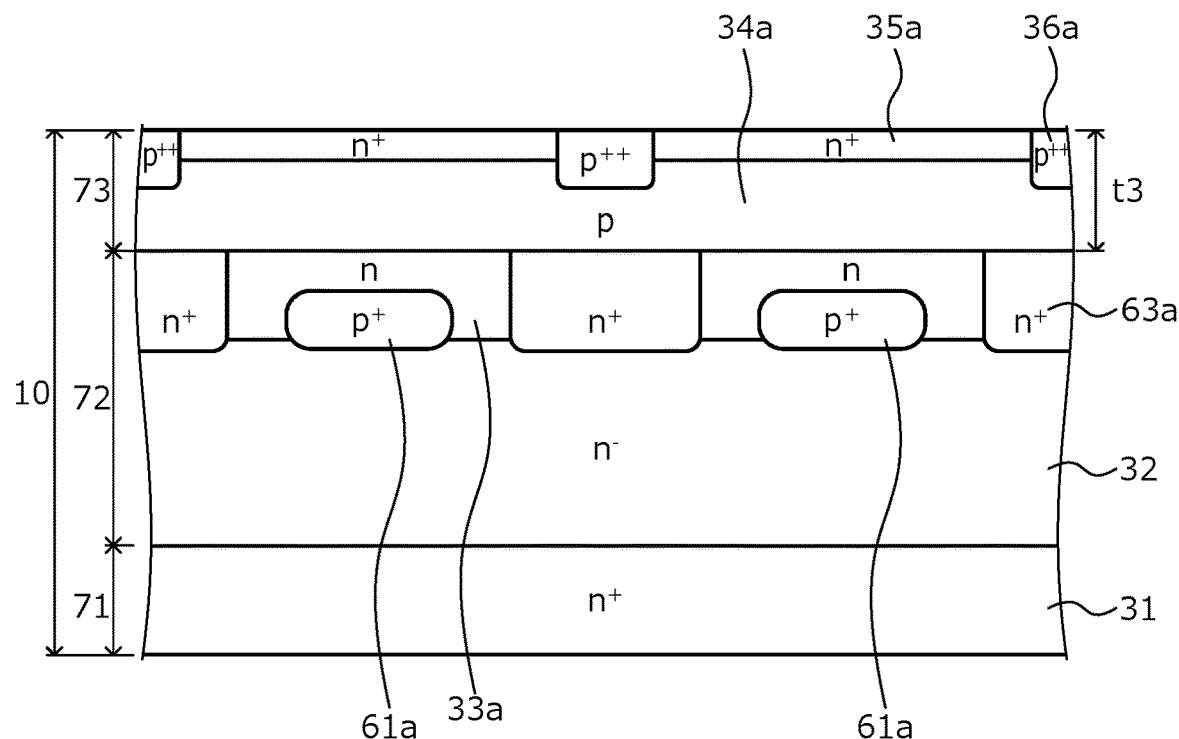
FIG. 12 is a cross-sectional view depicting a state of the semiconductor device according to the embodiment during manufacture.

Next, as depicted in FIGS. 11 and 12, on the $n^-$-type silicon carbide layer 72, the p-type silicon carbide layer 73 doped with a p-type impurity such as, for example, Al is epitaxially grown. A thickness t3 and a p-type impurity concentration of the p-type silicon carbide layer 73, for example, are about 1.3 µm and about $4.0×10^{17}/cm^3$, respectively. By the processes up to here, the semiconductor substrate 10 (semiconductor wafer) in which the $n^-$-type silicon carbide layer 72 and the p-type silicon carbide layer 73 are sequentially stacked on the $n^+$-type starting substrate 71 is fabricated.

Next, a process including photolithography and ion implantation as a set is repeatedly performed under different conditions, thereby selectively forming in the main effective region 1a, the $n^+$-type source regions 35a and the $p^{++}$-type contact regions 36a in the p-type silicon carbide layer 73 at a surface thereof. Portions of the p-type silicon carbide layer 73 of the main effective region 1a, between the $n^-$-type silicon carbide layer 72 and the $n^+$-type source regions 35a and between the n⁻-type silicon carbide layer 72 and the p⁺⁺-type contact regions 36a constitute the p-type base regions 34a.

Next, for diffused regions (the first and the second p⁺-type high-concentration regions 61a, 62a, the n⁺-type high-concentration regions 63a, the n-type current spreading regions 33a, the n⁺-type source regions 35a, and the p⁺⁺-type contact regions 36a) formed by ion implantation, for example, impurity activation is performed by a heat treatment (activation annealing) at a temperature of about 1700 degrees C. for about 2 minutes. The activation annealing may be performed collectively once for all of the diffused regions or may be performed each time diffused regions are formed by ion implantation.

Figure 13:
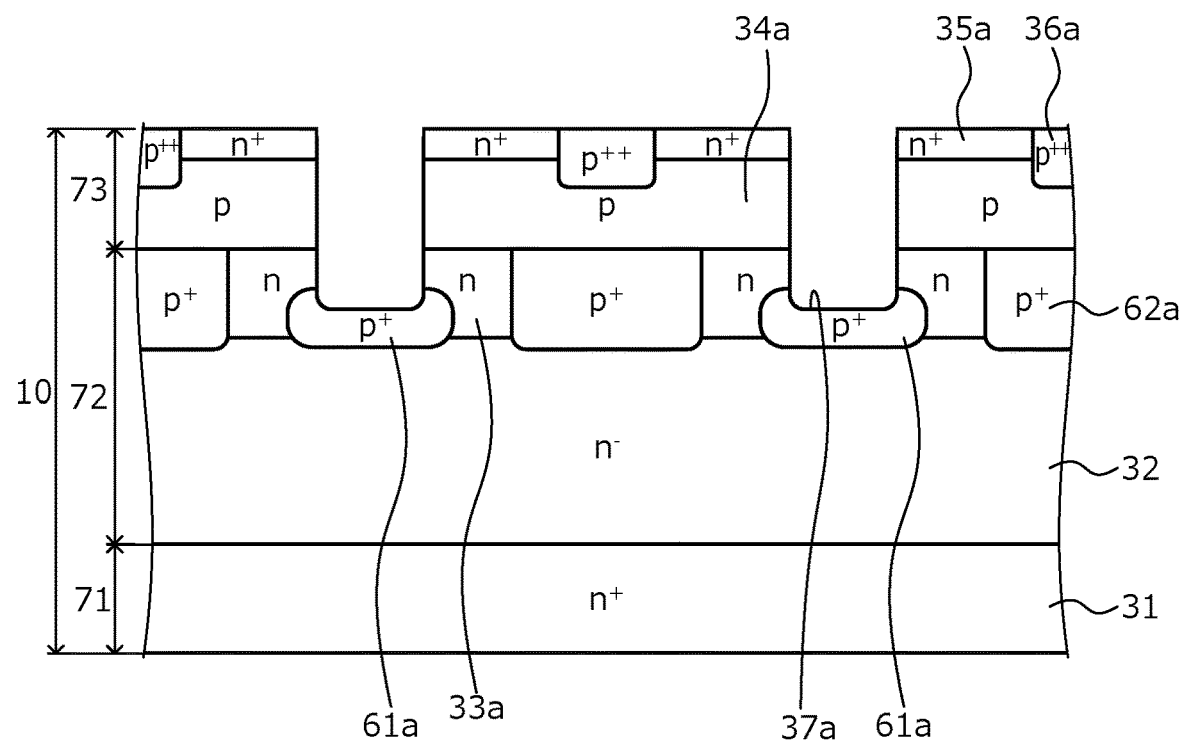
FIG. 13 is a cross-sectional view depicting a state of the semiconductor device according to the embodiment during manufacture.
Figure 14:
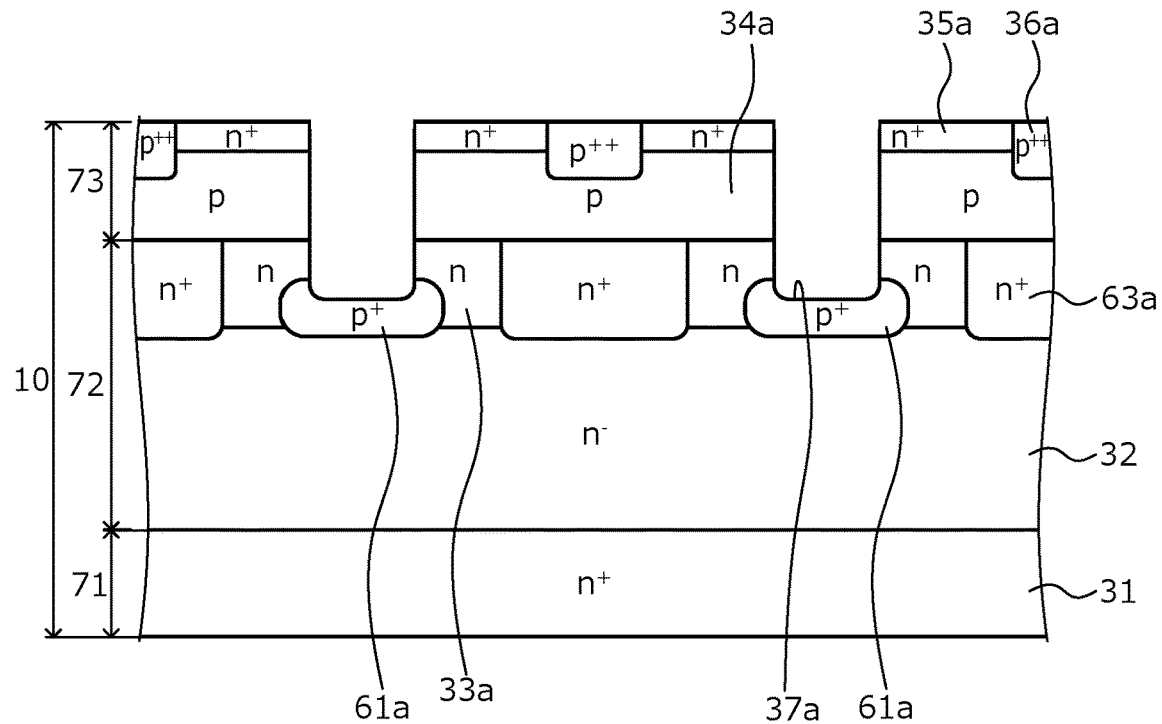
FIG. 14 is a cross-sectional view depicting a state of the semiconductor device according to the embodiment during manufacture.

Next, as depicted in FIGS. 13 and 14, by photolithography and etching, the trenches 37a that penetrate through the n⁺-type source regions 35a and the p-type base regions 34a from the front surface of the semiconductor substrate 10 to reach the n-type current spreading regions 33a and face the first p⁺-type high-concentration regions 61a in the depth direction Z (refer to FIGS. 2 to 4) are formed. The trenches 37a, for example, may reach the first p⁺-type high-concentration regions 61a and terminate in the first p⁺-type high-concentration regions 61a.

Figure 15:
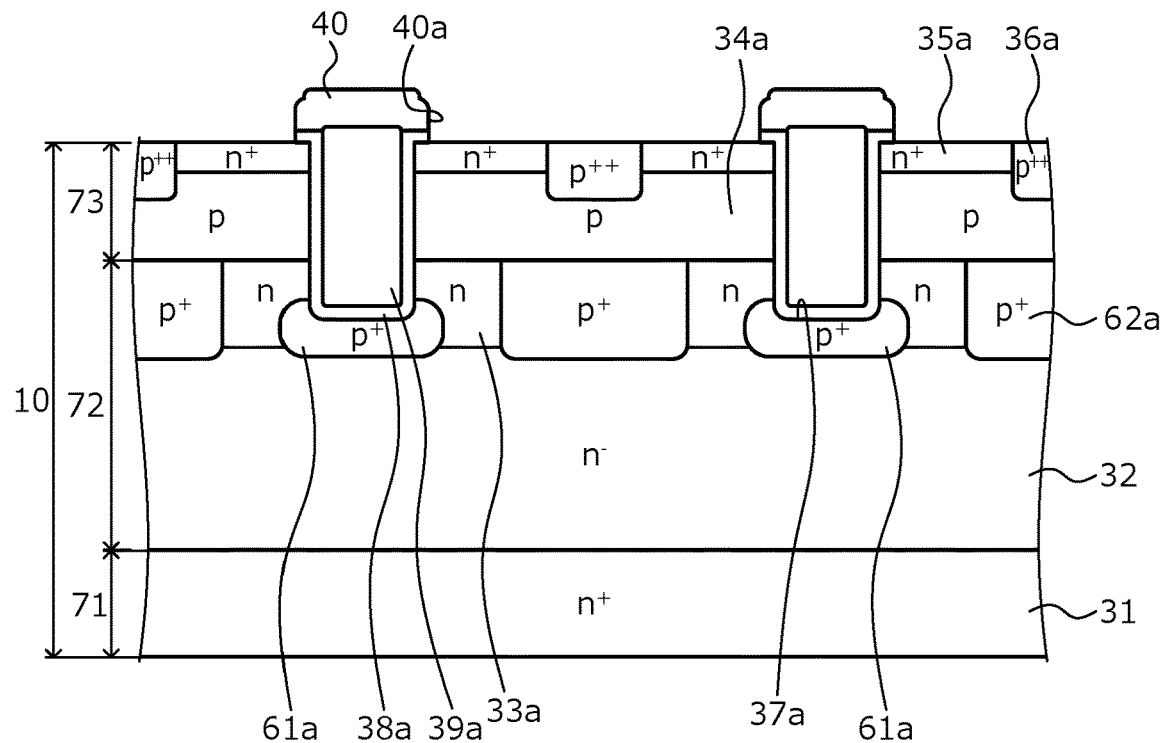
FIG. 15 is a cross-sectional view depicting a state of the semiconductor device according to the embodiment during manufacture.
Figure 16:
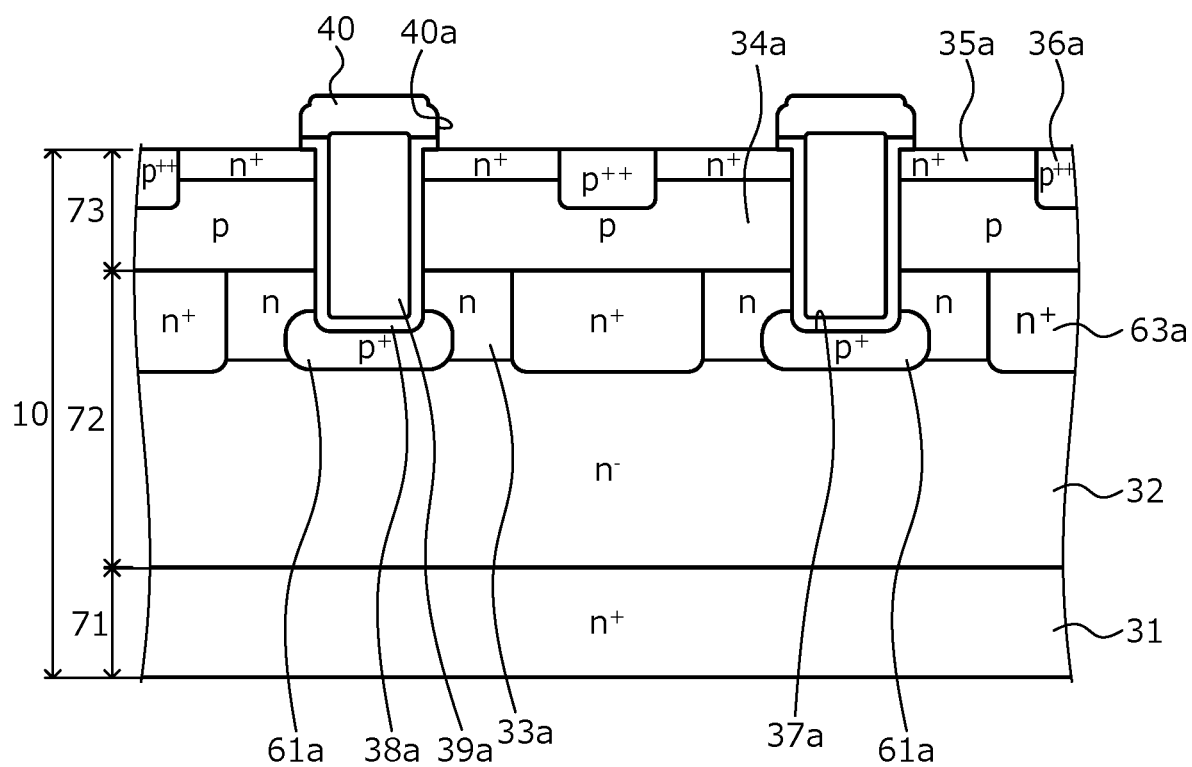
FIG. 16 is a cross-sectional view depicting a state of the semiconductor device according to the embodiment during manufacture.

Next, as depicted in FIGS. 15 and 16, along the front surface of the semiconductor substrate 10 and inner walls of the trenches 37a, the gate insulating films 38a are formed. The gate insulating films 38a, for example, may be a thermal oxide film formed by thermally oxidizing a semiconductor surface under an oxygen ($O_2$) atmosphere at a temperature of about 1000 degrees C. or may be a deposited film such as a high temperature oxide (HTO).

Next, for example, a polysilicon layer doped with phosphorus (P) is deposited (formed) on the front surface of the semiconductor substrate 10 so as to be embedded in the trenches 37a. Next, by photolithography and etching, the polysilicon layer is selectively removed, leaving only portions of the polysilicon layer in the trenches 37a, thereby forming the gate electrodes 39a.

Further, as described above, when the parts of the MOS gates of the main semiconductor device element 11 are formed, the parts of the semiconductor device elements (high-function portions such as the current sensing portion 12, the over-voltage protecting portion (not depicted), and the arithmetic circuit portion (not depicted), refer to FIGS. 2 and 3) fabricated on the same semiconductor substrate 10 suffice to be formed concurrently with the parts of the main semiconductor device element 11 having the same impurity concentration and depth as thereof.

The main semiconductor device element 11 is disposed in the p-type base regions 34a that have an island-like shape and are formed in surface regions of the semiconductor substrate 10, at the front surface thereof and thus, is isolated from other semiconductor device elements fabricated on the single semiconductor substrate 10, by the pn junctions between the p-type base regions 34a and the n⁻-type drift region 32. The current sensing portion 12 suffices to be disposed having the same structure as that of the main semiconductor device element 11, in the p-type base region 34b that has an island-like shape and is formed in a surface region of the semiconductor substrate 10, at the front surface thereof.

Next, in an entire area of the front surface of the semiconductor substrate 10, the interlayer insulating film 40 having a thickness of, for example, 1 μm and containing, for example, borophosphosilicate glass (BPSG), phosphosilicate glass (PSG), etc. is formed so as to cover the gate electrodes 39a. In the temperature sensing portion 13, the p-type polysilicon layer 81 and the n-type polysilicon layer 82 (refer to FIG. 3) suffice to be formed on the interlayer insulating film 40 and covered by the interlayer insulating film 83.

Next, by photolithography and etching, the first and the second contact holes 40a, 40b that penetrate through the interlayer insulating film 40 and the gate insulating films 38a in the depth direction Z are formed. The third and the fourth contact holes 83a, 83b that penetrate through the interlayer insulating film 83 in the depth direction Z are formed. In the first contact holes 40a, the n⁺-type source regions 35a and the p⁺⁺-type contact regions 36a of the main semiconductor device element 11 are exposed.

In the second contact holes 40b, the n⁺-type source regions 35b and the p⁺⁺-type contact regions 36b of the current sensing portion 12 are exposed. In the third and the fourth contact holes 83a, 83b, the p-type polysilicon layer 81 and the n-type polysilicon layer 82 of the temperature sensing portion 13 are exposed, respectively. Next, the interlayer insulating films 40, 83 are planarized by a heat treatment (reflow).

Next, the first TiN film 42a that covers only the interlayer insulating film 40 is formed. Next, on portions of the front surface of the semiconductor substrate 10 exposed in the first contact holes 40a, the NiSi films 41a are formed. Next, the first Ti film 43a, the second TiN film 44a, and the second Ti film 45a are sequentially stacked so as to cover the NiSi films 41a and the first TiN film 42a, thereby forming the barrier metal 46a. Next the source pad 21a is deposited on the second Ti film 45a.

Further, in the second contact holes 40b, the NiSi films 41b and the barrier metal 46b are formed concurrently with and configured similarly to the NiSi films 41a and the barrier metal 46a, respectively. In the second to the fourth contact holes 40b, 83a, 83b, the OC pad 22, the anode pad 23a, and the cathode pad 23b are each formed concurrently with and configured similarly to the source pad 21a.

Further, the drain electrode 51 that is in ohmic contact with the back surface of the semiconductor substrate 10 is formed and on the surface of the drain electrode 51, for example, a Ti film, an Ni film, and a gold (Au) film are sequentially stacked, thereby forming the drain pad (not depicted).

Next, on the front surface of the semiconductor substrate 10, the first protective films 49a to 49c containing a polyimide are selectively formed and in openings of the first protective films 49a to 49c, the different electrode pads 21a, 22, 23a, 23b are exposed. Next, on portions of the electrode pads 21a, 22, 23a, 23b exposed in the openings of the first protective films 49a to 49c, the plating films 47a to 47d are formed by a general plating process after a general plating pretreatment.

Next, the plating films 47a to 47d are dried by a heat treatment (baking). Next, the second protective films 50a to 50c that contain a polyimide are formed covering borders between the plating films 47a to 47d and the first protective films 49a to 49c. Next, the strength of the polyimide films (the first protective films 49a to 49c and the second protective films 50a to 50c) is enhanced by a heat treatment (curing). Next, on the plating films 47a to 47d, the terminal pins 48a to 48d are respectively bonded by a solder layer.

While not depicted, concurrently with the wiring structures on the electrode pads 21a, 22, 23a, 23b, a first protective film, a plating film, and a second protective film are sequentially formed on the gate pad 21b, and a wiring structure in which terminal pins are bonded by a solder layer is formed. Thereafter, the semiconductor substrate 10 (semiconductor wafer) is diced (cut) into individual chips, whereby the semiconductor device 20 depicted in FIGS. 1 to 5 is completed.

As described above, according to the embodiment, the first $p^+$-type high-concentration regions extending in the first direction are disposed facing the bottoms of the trenches in the depth direction, the second $p^+$-type high-concentration regions and the $n^+$-type high-concentration regions are selectively disposed adjacent to one another in the first direction between adjacent trenches. Electric field applied to the bottoms of the trenches is mitigated by the first and the second $p^+$-type high-concentration regions and a predetermined breakdown voltage of the main semiconductor device element is obtained. By disposing the second $p^+$-type high-concentration regions partially reduced in number and by disposing the $n^+$-type high-concentration regions in the portions where the second $p^+$-type high-concentration regions are reduced in number, the JFET resistance of the main semiconductor device element is reduced, the ON resistance decreases, and current capability is enhanced.

Further, according to the embodiment, in an operation state in which high electric field is applied between the drain and source, avalanche breakdown occurs at the pn junctions between the second $p^+$-type high-concentration regions and the $n^+$-type high-concentration regions, thereby enabling stable concentration of electric field at the pn junctions between the second $p^+$-type high-concentration regions and the $n^+$-type high-concentration regions. Thus, application of high electric field to the bottoms of the trenches is suppressed. As a result, when the main semiconductor device element turns OFF, high electric field concentrates at a location away from the bottoms of the trenches in the second direction and therefore, of positive hole current flowing in the $n^-$-type drift region to the source electrode, the current amount (interrupting current amount) discharged by the source electrode may be prevented from decreasing.

Further, in a MOSFET containing silicon as a semiconductor material, a trench gate structure is used to reduce the size of the unit cells and eliminate the JFET resistance to reduce the ON resistance. Even with a trench gate structure, the load of the electric field may be borne by pn junctions between the p-type base regions and the $n^-$-type drift region, whereby high electric field is not applied to the gate insulating films at the trench bottoms. Therefore, the first and the second $p^+$-type high-concentration regions that mitigate electric field applied to the trench bottoms as in the conventional structure (refer to FIGS. 21 and 22) are unnecessary.

Meanwhile, in the MOSFET containing silicon carbide as a semiconductor material, a trench gate structure is taken, whereby the size of the unit cells is reduced, and channel mobility increases, reducing the ON resistance. Further, increase of the channel mobility enables reduction of the thickness of the epitaxial layers stacked on the semiconductor substrate. On the other hand, the bandgap is 3 eV, which is wider than that of silicon and therefore, the load of the electric field cannot be borne by the pn junctions between the p-type base regions and the $n^-$-type drift region, whereby high electric field is applied to the gate insulating films at the trench bottoms.

Thus, like the conventional structure, while a configuration has be proposed in which the first and the second $p^+$-type high-concentration regions that mitigate electric field applied to the trench bottoms are provided in a striped pattern extending along the front surface of the semiconductor substrate, the JFET resistance occurs due to the pn junctions between the first and the second $p^+$-type high-concentration regions and the n-type current spreading region, and the greater the size of the unit cells is reduced, the greater is the JFET resistance. According to the embodiment, as described above, even when the first and the second $p^+$-type high-concentration regions are provided, the JFET resistance is reduced and reduction of the ON resistance is realized while various characteristics (low ON voltage, high-speed characteristics, high temperature characteristics) due to properties of silicon carbide may be obtained.

Further, according to the embodiment, by merely changing the pattern of an ion implantation mask for forming the first and the second $p^+$-type high-concentration regions that mitigate electric field applied to the trench bottoms, manufacturing processes similar to those for the conventional structure may be used and therefore, fabrication of the main semiconductor device element is facilitated.

Figure 17:
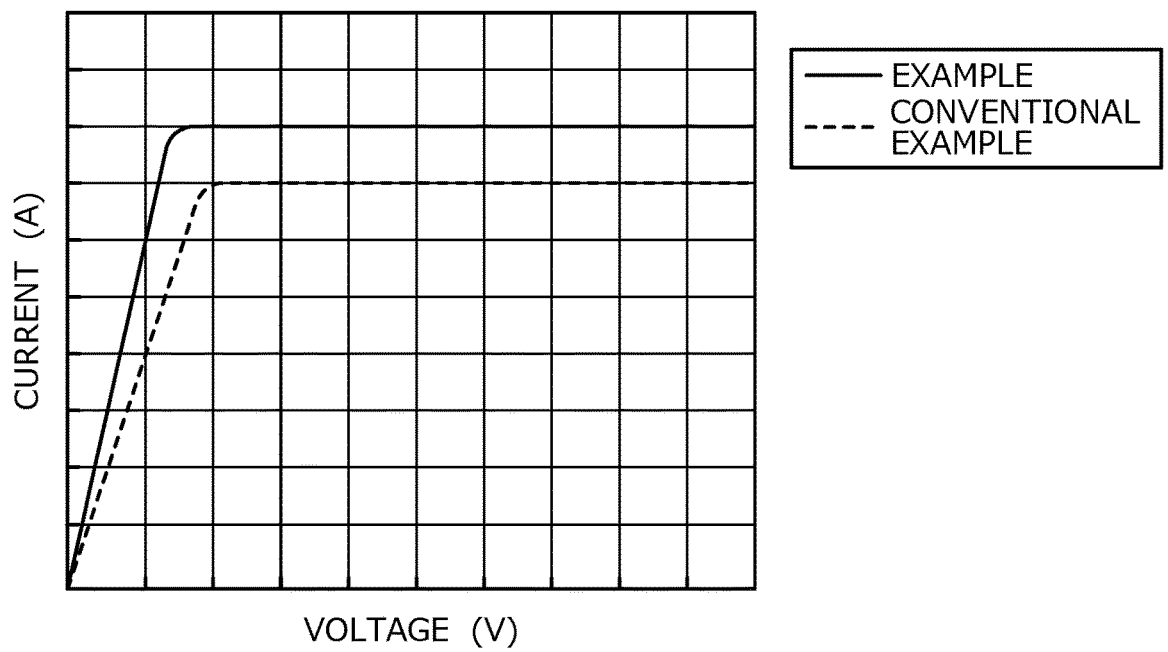
FIG. 17 is a characteristics diagram depicting voltage and current characteristics of an example.
Figure 18:
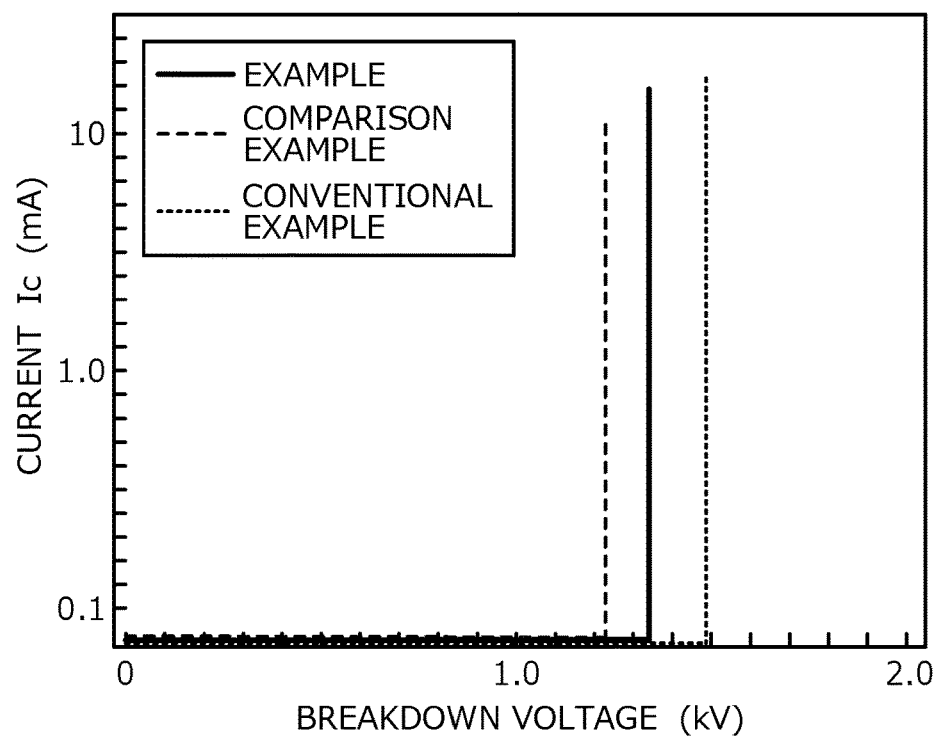
FIG. 18 is a characteristics diagram depicting breakdown voltage characteristics of the example.

Breakdown voltage characteristics and ON resistance characteristics of the main semiconductor device element 11 were verified. FIG. 17 is a characteristics diagram depicting voltage and current characteristics of an example. In FIG. 17, a horizontal axis indicates voltage between the drain and source (drain-source voltage) and a vertical axis indicates current between the drain and source (drain-source current). FIG. 18 is a characteristics diagram depicting breakdown voltage characteristics of the example. In FIG. 18, a horizontal axis indicates breakdown voltage (drain-source voltage limit) and a vertical axis indicates current capability (current value Ic when the drain-source voltage limit is applied).

A relationship between drain-source voltage and drain-source current of a sample (hereinafter, example) having the structure of the main semiconductor device element 11 of the semiconductor device 20 according to the embodiment described above (refer to FIGS. 2 to 5) is depicted in FIG. 17. Further, in FIG. 17, a relationship between drain-source voltage and drain-source current of the conventional semiconductor device 220 described above (hereinafter, conventional example, refer to FIGS. 21 and 22) is also depicted for comparison.

From the results depicted in FIG. 17, it was confirmed that, as compared to the conventional example, the example can begin flowing current by a smaller voltage value and the ON resistance is reduced. A reason for this is as follows. In the conventional example, the second $p^+$-type high-concentration regions 262 extend in the first direction X and have a length equal to the length of the trenches 237 in the longitudinal direction and therefore, the JFET regions (portions between the first and the second $p^+$-type high-concentration regions 261, 262 adjacent to one another) of the same width in the first direction X are present along the trenches 237.

On the other hand, in the example, the second $p^+$-type high-concentration regions 62a are disposed scattered in the first direction X, whereby no JFET region is formed in the portions where the second $p^+$-type high-concentration regions 62a are reduced in number. In addition, the $n^+$-type high-concentration regions 63a are disposed in the portions where the second $p^+$-type high-concentration regions 62a are reduced in number, whereby the depletion layer does not easily spread in the portions where the second $p^+$-type high-concentration regions 62a are reduced in number. As a result, the flow of current is facilitated by the portions where the second $p^+$-type high-concentration regions 62a are reduced in number.

Breakdown voltage measurement results for the example and the conventional example are shown in FIG. 18. In FIG.

18, breakdown voltage of a comparison example is also shown. The comparison example differs from the conventional example in that the comparison example only has the first p$^+$-type high-concentration regions 261 that face the bottoms of the trenches 237 and does not have the second p$^+$-type high-concentration regions 262 between the trenches 237 that are adjacent to one another. In other words, the comparison example is configured to mitigate electric field applied to the bottoms of the trenches 237 by only the first p$^+$-type high-concentration regions 261 that face the bottoms of the trenches 237.

From the results depicted in FIG. 18, it was confirmed that in the example, a higher breakdown voltage than the comparison example and current capability similar to that of the conventional example were obtained. A reason for this is as follows.

In the example, in an operation state in which high electric field is applied between the drain and source, avalanche breakdown is caused at the pn junctions between the second p$^+$-type high-concentration regions 62a and the n$^+$-type high-concentration regions 63a, whereby electric field may be stably concentrated at the pn junctions between the second p$^+$-type high-concentration regions 62a and the n$^+$-type high-concentration regions 63a. Therefore, as compared to the comparison example that is free of the second p$^+$-type high-concentration regions 262 between the trenches 237 that are adjacent to one another, the example mitigates the electric field applied to the bottoms of the trenches 37a.

Further, in the example, the second p$^+$-type high-concentration regions 62a are disposed partially reduced in number, whereby as compared to the conventional example, the breakdown voltage (drain-source voltage limit) is about 100V smaller, however, as described above the ON resistance is reduced (refer to FIG. 17). Therefore, for the example, operating loss (power loss) is small as compared to the conventional example and even when the drain-source voltage is small as compared to the conventional example, drain-source current about equal to that of the conventional example may flow.

Figure 19:
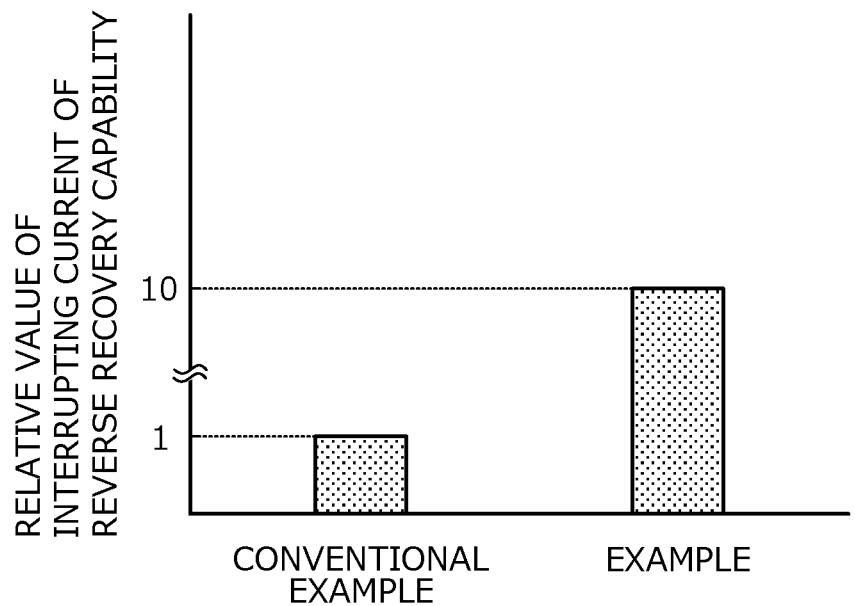
FIG. 19 is a characteristics diagram depicting current amount of interrupting current due to reverse recovery capability of the example.

Further, reverse recovery capability of the example described above was verified. FIG. 19 is a characteristics diagram depicting current amount of interrupting current due to reverse recovery capability of the example. Comparison results of current amounts of positive hole current (interrupting current) passing through the p-type base regions 34a, 234 and pulled out to the source pads 21a, 221 during turn OFF, for the example (the main semiconductor device element 11) described above and the conventional example (the semiconductor device 220) are depicted in FIG. 19.

As depicted in FIG. 19, it was confirmed that in the example, the current amount of the positive hole current that passes through the p-type base regions 34a and is pulled out to the source pad 21a during turn OFF increases as compared to the conventional example. In the example, during turn OFF, avalanche breakdown occurs at the pn junctions between the second p$^+$-type high-concentration regions 62a and the n$^+$-type high-concentration regions 63a, and the positive hole current generated by the avalanche concentrates at the pn junctions between the second p$^+$-type high-concentration regions 62a and the n$^+$-type high-concentration regions 63a, thereby enabling the positive hole current from the pn junctions to pass through the p-type base regions 34a and be pulled out to the source pad 21a.

Further, in the example, the current amount of the positive hole current that is pulled out to the source pad 21a during turn OFF is large, whereby base current of a parasitic bipolar junction transistor (BJT) formed by the n$^+$-type source regions 35a, the p-type base regions 34a, and the n$^-$-type drift region 32 decreases and turn ON of the parasitic BJT is difficult. Therefore, the flow of large current due to erroneous operation of the parasitic BJT may be suppressed and resistance to destruction due to avalanche may be enhanced.

On the other hand, in the conventional example, a reason that the current amount (interrupting current amount) of the positive hole current from inside the n$^-$-type drift region 232 and discharged by the source pad 221 is small is that in the conventional example, high electric field is presumed to be easily applied to locations near the bottoms of the trenches 237, as compared to the example. At the locations where high electric field of the bottoms of the trenches 237 concentrates, the positive hole current that flows from the n$^-$-type drift region 232 to the source pad 221 during turn OFF concentrates, whereby the current amount (interrupting current amount) discharged by the source pad 221 decreases.

Figure 20:
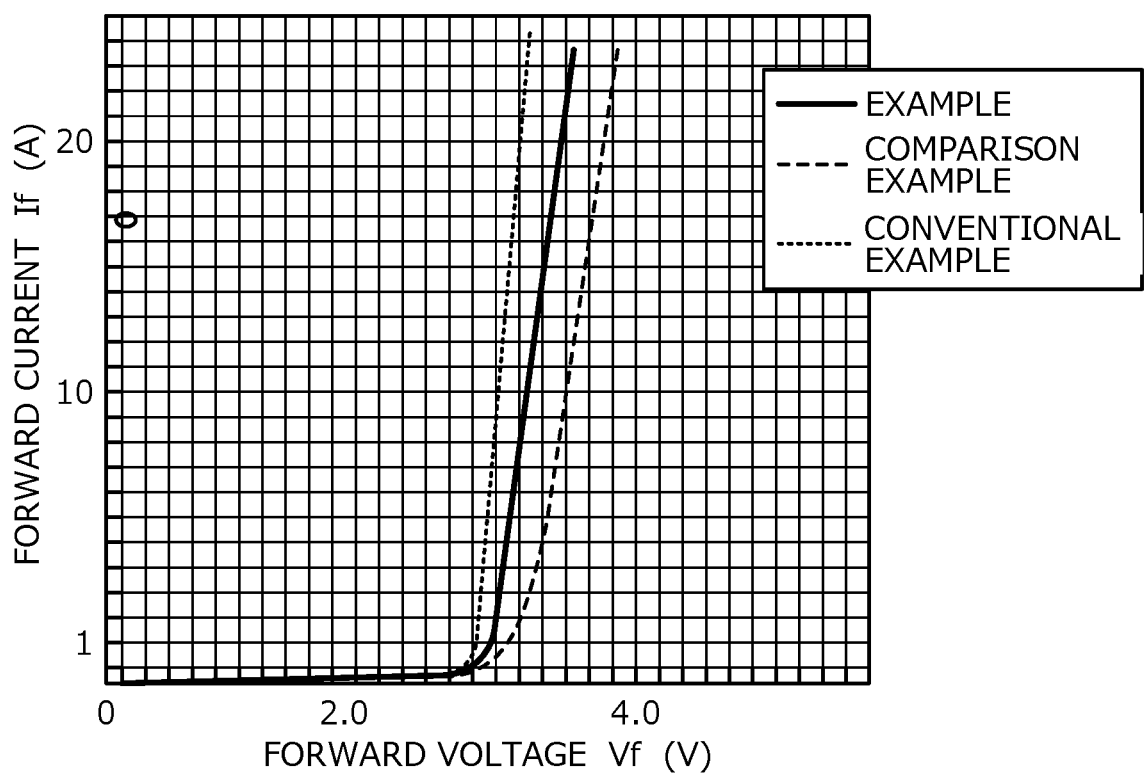
FIG. 20 is a characteristics diagram depicting forward characteristics of a built-in diode of the example.

Further, forward characteristics of the built-in diode of the example described above were verified. FIG. 20 is a characteristics diagram depicting forward characteristics of the built-in diode of the example.

In FIG. 20, a horizontal axis indicates the forward voltage Vf and a vertical axis indicates the forward current If. Forward characteristics of the built-in diodes of the example described above, the conventional example, and the comparison example are depicted in FIG. 20. The built-in diode of the example is a parasitic diode formed in the semiconductor substrate 10, by pn junctions between the first and the second p$^+$-type high-concentration regions 61a, 62a, the p-type base regions 34a, the n-type current spreading regions 33a, the n$^+$-type high-concentration regions 63a, and the n$^-$-type drift region 32.

The built-in diode of the conventional example is a parasitic diode formed in the semiconductor substrate 210, by pn junctions between the first and the second p$^+$-type high-concentration regions 261, 262, the p-type base regions 234, the n-type current spreading regions 233, and the n$^-$-type drift region 232. The built-in diode of the comparison example is a parasitic diode formed in the semiconductor substrate 210, by pn junctions between the first p$^+$-type high-concentration regions, the p-type base regions, the n-type current spreading regions, and the n$^-$-type drift region.

From the results depicted in FIG. 20, in the built-in diode of the example, the total impurity amount of the p-type regions (the first and the second p$^+$-type high-concentration regions 61a, 62a and the p-type base regions 34a) functioning as p-type anode regions is lower as compared to the built-in diode of the conventional example and therefore, the forward voltage Vf is higher. On the other hand, in the built-in diode of the example, the total impurity amount of the p-type regions functioning as p-type anode regions is large as compared to the built-in diode of the comparison example and the forward voltage Vf is lower.

From these results, it was confirmed that in the example, the forward voltage characteristics of the built-in diode could be adjusted by the impurity amount of the second p$^+$-type high-concentration regions 62a. Therefore, by variously changing the volume ratio of the second p$^+$-type high-concentration regions 62a and the n$^+$-type high-concentration regions 63a, the breakdown voltage characteristics and the ON resistance characteristics of the MOSFET (the main semiconductor device element 11), and the forward voltage characteristics of the built-in diode of the MOSFET may be adjusted, whereby the degrees of freedom in design are high.

In the foregoing, the present invention is not limited to the embodiments described above and may be variously modified within a range not departing from the spirit of the invention. For example, in the embodiments described above, in an instance in which the n$^+$-type high-concentration regions are omitted and instead of the n$^+$-type high-concentration regions, the n-type current spreading regions are adjacent to the second p$^+$-type high-concentration regions in the first direction, effects similar to those of the present invention are achieved. In other words, n-type regions having an n-type impurity concentration at least equal to that of the n-type current spreading regions suffice to be adjacent to the second p$^+$-type high-concentration regions in the first direction.

Further, in the embodiments described above, the n-type current spreading regions may be omitted and in the depth direction, p-type base regions and the n$^-$-type drift region may be adjacent to one another. In this instance, configuration is such that in the description above "the n-type current spreading regions" is replaced with "the n$^-$-type drift region". The present invention is further applicable in an instance in which instead of silicon carbide, a wide bandgap semiconductor other than silicon carbide is used as a semiconductor material. Further, the present invention is similarly implemented when conductivity types (n-type, p-type) are reversed.

According to the invention described above, in the semiconductor device in which electric field applied to the trench bottoms is mitigated by the first and the second high-concentration regions, the second high-concentration regions are disposed partially reduced in number, whereby the JFET resistance is reduced.

The semiconductor device according to the present invention achieves an effect in that ON resistance may be reduced.

As described above, the semiconductor device according to the present invention is useful for power semiconductor devices that control high voltage and large current.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device, comprising:
   a semiconductor substrate containing a semiconductor having a bandgap wider than that of silicon, the semiconductor substrate having a first main surface and a second main surface opposite to each other;
   a first semiconductor region of a first conductivity type, provided in the semiconductor substrate;
   a second semiconductor region of a second conductivity type, provided between the first main surface of the semiconductor substrate and the first semiconductor region;
   a plurality of third semiconductor regions of the first conductivity type, each selectively provided between the first main surface of the semiconductor substrate and the second semiconductor region;
   a plurality of trenches each penetrating through the third semiconductor regions and the second semiconductor region, and reaching the first semiconductor region;
   a plurality of first high-concentration regions of the second conductivity type, each of which is selectively provided in the first semiconductor region and faces a respective one of bottoms of the trenches in a depth direction, the first high-concentration regions having an impurity concentration higher than an impurity concentration of the second semiconductor region;
   a plurality of second high-concentration regions of the second conductivity type, each of which is selectively provided in the first semiconductor region, is separate from the first high-concentration regions and the trenches, and is in contact with the second semiconductor region, the second high-concentration regions reaching positions deeper from the second semiconductor region than are the bottoms of the trenches and having an impurity concentration higher than the impurity concentration of the second semiconductor region;
   a plurality of gate electrodes each provided in a respective one of the trenches via a respective one of a plurality of gate insulating films;
   a first electrode electrically connected to the second semiconductor region, the third semiconductor regions, the first high-concentration regions, and the second high-concentration regions; and
   a second electrode provided on the second main surface of the semiconductor substrate, wherein
   the trenches each have a linear shape that extends in a first direction parallel to the first main surface of the semiconductor substrate,
   the first high-concentration regions each have a linear shape that extends in the first direction, and
   the second high-concentration regions are apart from one another by a predetermined interval in the first direction,
   the semiconductor device further comprising a plurality of fourth semiconductor regions of the first conductivity type, each of which extends from a respective one of the first high-concentration regions to a respective one of the second high-concentration regions that are adjacent to each other in a second direction parallel to the semiconductor substrate and orthogonal to the first direction, and also extends from the respective one of the second high-concentration regions to a respective another one of the second high-concentration regions that are adjacent to each other in the first direction, the fourth semiconductor regions having an impurity concentration higher than an impurity concentration of the first semiconductor region.

2. The semiconductor device according to claim 1, further comprising
   a plurality of third high-concentration regions of the first conductivity type, selectively provided in the first semiconductor region, each of which is separate from the first high-concentration regions and the trenches, and is in contact with the second semiconductor region, the third high-concentration regions reaching positions deeper than are the bottoms of the trenches as measured from the second semiconductor region and having an impurity
   concentration higher than an impurity concentration of the first semiconductor region, wherein the third high-concentration regions are each provided between a respective pair of the second high-concentration regions that are adjacent to each other in the first direction, each of the third high-concentration regions being adjacent to the respective pair of the second high-concentration regions in the first direction.

3. The semiconductor device according to claim 2, wherein
the second high-concentration regions and the third high-concentration regions are disposed to repeatedly alternate with one another in the first direction.

4. The semiconductor device according to claim 2, wherein
an impurity concentration of the first conductivity type of the third high-concentration regions is a same as an impurity concentration of the second conductivity type of the second high-concentration regions.

5. The semiconductor device according to claim 2, wherein
a width of each of the second high-concentration regions in the first direction is narrower than a width of the each of the second high-concentration regions in the second direction.

6. The semiconductor device according to claim 2, wherein
a width of each of the third high-concentration regions in the first direction is a same measurement as a width of each of the second high-concentration regions in the first direction.

7. The semiconductor device according to claim 2, wherein
a width of each of the third high-concentration regions in the second direction is a same measurement as a width of each of the second high-concentration regions in the second direction.

8. The semiconductor device according to claim 2, further comprising
a plurality of fourth semiconductor regions of the first conductivity type, each of which extends from a respective one of the first high-concentration regions to a respective one of the second high-concentration regions that are adjacent to each other in the second direction, and also extends from the respective one of the first high-concentration regions to a respective one of the third high-concentration regions that are adjacent to each other in the second direction, the fourth semiconductor regions having an impurity concentration higher than an impurity concentration of the first semiconductor region, wherein
the impurity concentration of the third high-concentration regions is higher than the impurity concentration of the fourth semiconductor regions.

9. A semiconductor device, comprising:
a semiconductor substrate containing a semiconductor having a bandgap wider than that of silicon, the semiconductor substrate having a first main surface and a second main surface opposite to each other;
a first semiconductor region of a first conductivity type, provided in the semiconductor substrate;
a second semiconductor region of a second conductivity type, provided between the first main surface of the semiconductor substrate and the first semiconductor region;
a plurality of third semiconductor regions of the first conductivity type, each selectively provided between the first main surface of the semiconductor substrate and the second semiconductor region;
a plurality of trenches each penetrating through the third semiconductor regions and the second semiconductor region, and reaching the first semiconductor region;
a plurality of first high-concentration regions of the second conductivity type, each of which is selectively provided in the first semiconductor region and faces a respective one of bottoms of the trenches in a depth direction, the first high-concentration regions having an impurity concentration higher than an impurity concentration of the second semiconductor region;
a plurality of second high-concentration regions of the second conductivity type, each of which is selectively provided in the first semiconductor region, is separate from the first high-concentration regions and the trenches, and is in contact with the second semiconductor region, the second high-concentration regions reaching positions deeper from the second semiconductor region than are the bottoms of the trenches and having an impurity concentration higher than the impurity concentration of the second semiconductor region;
a plurality of third high-concentration regions of the first conductivity type, selectively provided in the first semiconductor region, each of which is separate from the first high-concentration regions and the trenches, and is in contact with the second semiconductor region, the third high-concentration regions reaching positions deeper than are the bottoms of the trenches as measured from the second semiconductor region and having an impurity concentration higher than an impurity concentration of the first semiconductor region;
a plurality of gate electrodes each provided in a respective one of the trenches via a respective one of a plurality of gate insulating films;
a first electrode electrically connected to the second semiconductor region, the third semiconductor regions, the first high-concentration regions, and the second high-concentration regions; and
a second electrode provided on the second main surface of the semiconductor substrate, wherein
the trenches each have a linear shape that extends in a first direction parallel to the first main surface of the semiconductor substrate,
the first high-concentration regions each have a linear shape that extends in the first direction,
the second high-concentration regions are apart from one another by a predetermined interval in the first direction,
the third high-concentration regions are each provided between a respective pair of the second high-concentration regions that are adjacent to each other in the first direction, each of the third high-concentration regions being adjacent to the respective pair of the second high-concentration regions in the first direction; and
an impurity concentration of the first conductivity type of the third high-concentration regions is a same as an impurity concentration of the second conductivity type of the second high-concentration regions.

10. A semiconductor device, comprising:
a semiconductor substrate containing a semiconductor having a bandgap wider than that of silicon, the semiconductor substrate having a first main surface and a second main surface opposite to each other;
a first semiconductor region of a first conductivity type, provided in the semiconductor substrate;
a second semiconductor region of a second conductivity type, provided between the first main surface of the semiconductor substrate and the first semiconductor region;
a plurality of third semiconductor regions of the first conductivity type, each selectively provided between the first main surface of the semiconductor substrate and the second semiconductor region;

a plurality of trenches each penetrating through the third semiconductor regions and the second semiconductor region, and reaching the first semiconductor region;

a plurality of first high-concentration regions of the second conductivity type, each of which is selectively provided in the first semiconductor region and faces a respective one of bottoms of the trenches in a depth direction, the first high-concentration regions having an impurity concentration higher than an impurity concentration of the second semiconductor region;

a plurality of second high-concentration regions of the second conductivity type, each of which is selectively provided in the first semiconductor region, is separate from the first high-concentration regions and the trenches, and is in contact with the second semiconductor region, the second high-concentration regions reaching positions deeper from the second semiconductor region than are the bottoms of the trenches and having an impurity concentration higher than the impurity concentration of the second semiconductor region;

a plurality of gate electrodes each provided in a respective one of the trenches via a respective one of a plurality of gate insulating films;

a plurality of third high-concentration regions of the first conductivity type, selectively provided in the first semiconductor region, each of which is separate from the first high-concentration regions and the trenches, and is in contact with the second semiconductor region, the third high-concentration regions reaching positions deeper than are the bottoms of the trenches as measured from the second semiconductor region and having an impurity concentration higher than an impurity concentration of the first semiconductor region;

a first electrode electrically connected to the second semiconductor region, the third semiconductor regions, the first high-concentration regions, and the second high-concentration regions; and a second electrode provided on the second main surface of the semiconductor substrate, wherein the trenches each have a linear shape that extends in a first direction parallel to the first main surface of the semiconductor substrate, the first high-concentration regions each have a linear shape that extends in the first direction, the second high-concentration regions are apart from one another by a predetermined interval in the first direction, the third high-concentration regions are each provided between a respective pair of the second high-concentration regions that are adjacent to each other in the first direction, each of the third high-concentration regions being adjacent to the respective pair of the second high-concentration regions in the first direction, and a width of each of the third high-concentration regions in the first direction is a same measurement as a width of each of the second high-concentration regions in the first direction.

* * * * *